(12) United States Patent
Sim et al.

(10) Patent No.: US 12,635,097 B2
(45) Date of Patent: May 19, 2026

(54) ELECTRONIC DEVICE INCLUDING DISPLAY

(71) Applicant: Samsung Electronics Co., Ltd., Suwon-si (KR)

(72) Inventors: Hyunwoo Sim, Suwon-si (KR); Sangseol Lee, Suwon-si (KR); Heeseok Jung, Suwon-si (KR); Jungsik Park, Suwon-si (KR); Yongseok Lee, Suwon-si (KR); Soyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 18/404,177

(22) Filed: Jan. 4, 2024

(65) Prior Publication Data

US 2024/0179864 A1     May 30, 2024

Related U.S. Application Data

(63) Continuation of application No. PCT/KR2023/019123, filed on Nov. 24, 2023.

(30) Foreign Application Priority Data

Nov. 28, 2022    (KR) ........................ 10-2022-0161407
Jan. 9, 2023    (KR) ........................ 10-2023-0002836

(51) Int. Cl.
H05K 5/06      (2006.01)
G06F 1/16      (2006.01)
H04M 1/02      (2006.01)

(52) U.S. Cl.
CPC .............. H05K 5/062 (2013.01); G06F 1/16 (2013.01); G06F 1/1637 (2013.01);
(Continued)

(58) Field of Classification Search
CPC .......... H05K 5/062; H05K 5/06; H05K 5/061; G06F 1/16; G06F 1/1637; G06F 1/1656; G06F 1/1658; H04M 1/02
See application file for complete search history.

(56) References Cited

U.S. PATENT DOCUMENTS 9,338,910 B2 *   5/2016   Hattori ................... H05K 5/069
10,007,343 B2 *   6/2018   Kim ....................... G06V 40/13
(Continued)

FOREIGN PATENT DOCUMENTS

CN       210627163 U    5/2020
EP        3151524 B1    12/2018
(Continued)

OTHER PUBLICATIONS

Search Report and Written Opinion dated Feb. 20, 2024 issued in International Patent Application No. PCT/ KR2023/019123.
(Continued)

*Primary Examiner* — Rockshana D Chowdhury
*Assistant Examiner* — Martin Antonio Asmat Uceda
(74) *Attorney, Agent, or Firm* — Nixon & Vanderhye P.C.

(57)     ABSTRACT

An electronic device according to an embodiment of the disclosure may include: a housing; a waterproof member comprising a waterproof material disposed along a periphery of the housing on one surface of the housing; a window cover disposed to face the one surface of the housing; a display disposed between the window cover and the housing and including a bending part located at one end part of the electronic device; and a molding part extending along peripheries of the window cover and the display and disposed on one surface of the waterproof member, wherein at least a part of the molding part may be disposed in one
(Continued)

direction toward an outside of the electronic device and in another direction opposite the one direction based on the bending part of the display.

9 Claims, 19 Drawing Sheets

(52) U.S. Cl.
CPC .......... *G06F 1/1656* (2013.01); *G06F 1/1658* (2013.01); *H04M 1/02* (2013.01); *H05K 5/06* (2013.01); *H05K 5/061* (2013.01)

(56)                     References Cited

U.S. PATENT DOCUMENTS

| | | | | |
|---|---|---|---|---|
| 10,068,960 | B2 * | 9/2018 | Ki ...................... | H10D 30/6755 |
| 10,405,446 | B2 | 9/2019 | Choi et al. | |
| 10,631,437 | B2 * | 4/2020 | Fournier .............. | H05K 1/0216 |
| 11,284,547 | B2 * | 3/2022 | Shin .......................... | G06F 1/16 |
| 11,527,687 | B2 | 12/2022 | Ha et al. | |
| 11,637,919 | B2 * | 4/2023 | Baker ................... | H04M 1/026 |
| | | | | 455/564 |
| 11,783,629 | B2 * | 10/2023 | Tomasetta ............... | G06F 21/32 |
| | | | | 348/77 |
| 11,796,852 | B2 * | 10/2023 | Ma ......................... | G06F 1/1637 |
| 12,079,036 | B2 | 9/2024 | Barrett et al. | |
| 12,501,755 | B2 * | 12/2025 | Sakai ................... | H10H 20/857 |
| 2008/0081679 | A1 * | 4/2008 | Kawasaki ............... | H04M 1/18 |
| | | | | 455/575.8 |
| 2014/0042406 | A1 * | 2/2014 | Degner ................ | H10K 77/111 |
| | | | | 438/34 |
| 2014/0206420 | A1 * | 7/2014 | Neichi .................... | H04M 1/18 |
| | | | | 455/575.8 |
| 2015/0173497 | A1 * | 6/2015 | Yu ............................. | A45F 5/00 |
| | | | | 224/218 |
| 2015/0318885 | A1 * | 11/2015 | Earle ...................... | H04B 1/385 |
| | | | | 455/575.6 |

| | | | | |
|---|---|---|---|---|
| 2017/0099742 | A1 | 4/2017 | Choi et al. | |
| 2017/0295269 | A1 * | 10/2017 | Hosoi ................... | H04R 1/1008 |
| 2017/0344056 | A1 * | 11/2017 | Kim ..................... | H04L 12/2803 |
| 2018/0175485 | A1 * | 6/2018 | Yano ...................... | H01Q 1/243 |
| 2019/0006615 | A1 | 1/2019 | Jung et al. | |
| 2019/0096610 | A1 * | 3/2019 | Kanemaki .............. | H01H 23/06 |
| 2019/0108951 | A1 * | 4/2019 | Tsuchiya ............... | G06F 1/1684 |
| 2019/0254129 | A1 | 8/2019 | Cho et al. | |
| 2019/0259551 | A1 * | 8/2019 | Cha .......................... | H04M 1/02 |
| 2021/0216160 | A1 | 7/2021 | Lee et al. | |
| 2021/0405688 | A1 | 12/2021 | Barrett et al. | |
| 2022/0129040 | A1 | 4/2022 | Kim et al. | |
| 2022/0137667 | A1 | 5/2022 | Kim et al. | |
| 2022/0181581 | A1 * | 6/2022 | Kawamura ........... | H10K 71/80 |
| 2022/0286539 | A1 | 9/2022 | Stobbe et al. | |
| 2022/0329678 | A1 | 10/2022 | Zhang et al. | |
| 2022/0374048 | A1 * | 11/2022 | Niu ..................... | G06F 3/04164 |

FOREIGN PATENT DOCUMENTS

| | | | | |
|---|---|---|---|---|
| EP | 4195184 | 6/2023 | | |
| KR | 10-2018-0026191 | 3/2018 | | |
| KR | 20180026191 A * | 3/2018 | .............. | H04B 1/38 |
| KR | 10-2020-0014951 | 2/2020 | | |
| KR | 20200101224 A * | 8/2020 | ......... | H04M 1/0268 |
| KR | 10-2020-0129349 | 11/2020 | | |
| KR | 10-2022-0017555 | 2/2022 | | |
| KR | 20220026573 A | 3/2022 | | |
| KR | 20220054486 A | 5/2022 | | |
| KR | 20220060773 A | 5/2022 | | |
| KR | 10-2022-0124079 | 9/2022 | | |
| KR | 10-2022-0148638 | 11/2022 | | |

OTHER PUBLICATIONS

Extended European Search Report dated Jan. 28, 2026 issued in European Patent Application No. 23898218.5, 15 pp.

* cited by examiner

ELECTRONIC DEVICE INCLUDING DISPLAY

CROSS-REFERENCE TO RELATED APPLICATIONS

This application is a continuation of International Application No. PCT/KR2023/019123 designating the United States, filed on Nov. 24, 2023, in the Korean Intellectual Property Receiving Office and claiming priority to Korean Patent Application Nos. 10-2022-0161407, filed on Nov. 28, 2022, and 10-2023-0002836, filed on Jan. 9, 2023, in the Korean Intellectual Property Office, the disclosures of each of which are incorporated by reference herein in their entireties.

BACKGROUND

Field

The disclosure relates to an electronic device including a display.

Description of Related Art

An electronic device may include a housing and a display module disposed to cover one surface of the housing. The display module may include a bending part located at a lower end part of the electronic device.

A waterproof tape may be disposed between the housing and the display module of the electronic device. The waterproof tape may be disposed to extend along a periphery of the electronic device. The waterproof tape disposed on one side and the other side of the electronic device and the waterproof tape located at the lower end part of the electronic device may be connected with each other through a cure in place gasket (CIPG).

Since the bending part of the display module is formed as a structure vulnerable to an external impact, there is a need for a separate structure for reinforcing the bending part.

In case of applying a cure in place gasket (CIPG) in order to connect the respective waterproof tapes with each other in the electronic device, it may not be easy to repair the display module. For example, in case that the display module is redisposed after being separated from the electronic device in order to repair the display module, a process for redisposing the CIPG in the electronic device should be performed, additional time and costs for repair may be consumed.

SUMMARY

According to an example embodiment of the disclosure, an electronic device may include: a housing; a waterproof member comprising a waterproof material disposed along a periphery of the housing on one surface of the housing; a window cover disposed to face the one surface of the housing; a display disposed between the window cover and the housing and including a bending part located at one end part of the electronic device; and a molding part extending along peripheries of the window cover and the display and disposed on one surface of the waterproof member.

In an example embodiment, at least a part of the molding part may be disposed in one direction toward an outside of the electronic device and in another direction opposite to the one direction based on the bending part of the display.

According to an example embodiment of the disclosure, an electronic device may include: a housing; a waterproof member comprising a waterproof material disposed along a periphery of the housing on one surface of the housing; a window cover disposed to face the one surface of the housing; a display disposed between the window cover and the housing and including a bending part located at one end part of the electronic device; and a molding part extending from the one end part of the electronic device along the bending part of the display and disposed on one surface of the waterproof member.

In an example embodiment, the molding part may include an inclined area extending from one end and another end of the molding part toward one surface of the display in a direction inclined based on one surface of the molding part, and at least a part of the molding part may be disposed in one direction toward an outer side of the electronic device and in the another direction opposite to the one direction based on the bending part of the display.

According to an example embodiment of the disclosure, an electronic device may include: a housing; fasteners connected to at least a part of the housing and detachably attaching the electronic device to a part of a body of a user; a window cover disposed to face one surface of the housing; a display disposed between the window cover and the housing and including a bending part located at one end part of the electronic device; a molding part extending along peripheries of the window cover and the display; and a waterproof member comprising a waterproof material disposed between the molding part and the housing.

The electronic device including the display according to various example embodiments of the disclosure can reinforce rigidity of the bending part through disposition of the molding part around the bending part of the display module.

The electronic device including the display according to various example embodiments of the disclosure can save costs being consumed in the CIPG manufacturing and disposition, and can improve ease to repair the display module.

The electronic device including the display according to various example embodiments of the disclosure can reduce a black matrix (BM) area in which the screen is not displayed on the display since the electronic device is formed with a structure in which the bonding part of the lower end part is removed.

DETAILED DESCRIPTION

Figure 1:
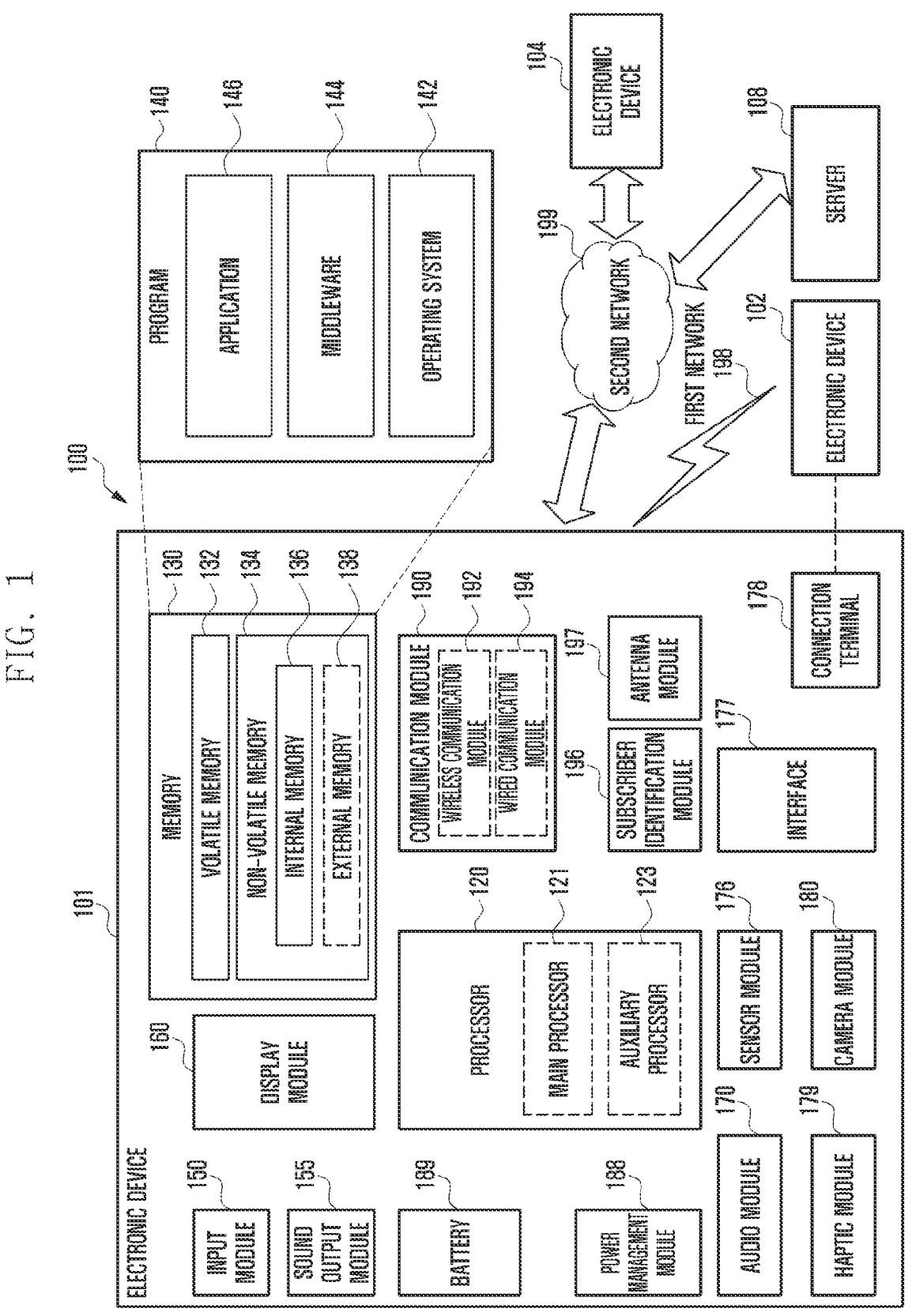
FIG. 1 is a block diagram illustrating an example electronic device in a network environment according to various embodiments.

FIG. 1 is a block diagram illustrating an example electronic device in a network environment according to an embodiment. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IOT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
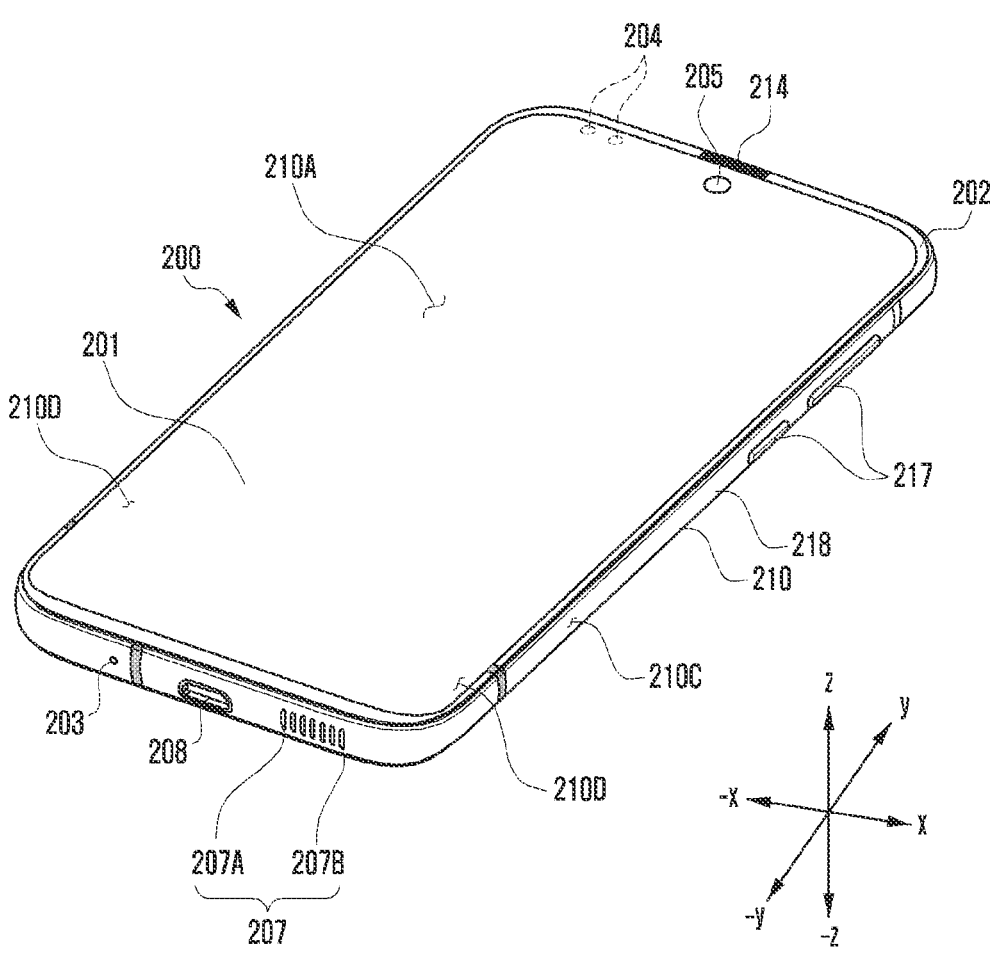
FIGS. 2A and 2B are front and rear perspective views, respectively, illustrating an electronic device according to various embodiments.
Figure 2B:
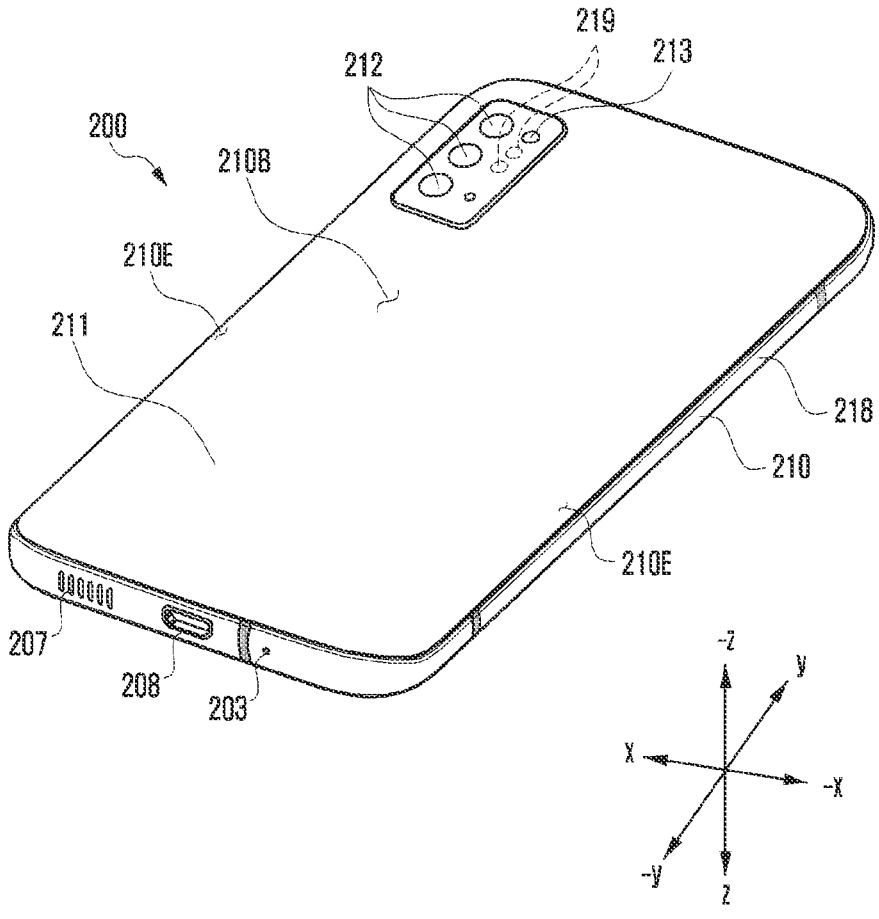

FIG. 2A is a front perspective view of an electronic device 200 according to various embodiments, and FIG. 2B is a rear perspective view of the electronic device 200 shown in FIG. 2A according to various embodiments.

The electronic device 200 in FIGS. 2A and 2B may be at least partially similar to the electronic device 101 in FIG. 1 or may further include other embodiments.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, input device 203, the sound output devices 207 and 214, sensor modules 204 and 219, camera modules 205, 212 and 213, a key input device 217, an indicator (not shown), and connector 208. The mobile electronic device 200 may omit at least one (e.g., the key input device 217 or the indicator) of the above components, or may further include other components.

The display 201 may be exposed (e.g., visible) through a substantial portion of the front plate 202, for example. At least a part of the display 201 may be exposed (e.g., visible) through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The input device 103 may include at least one microphone. In certain embodiments, the input device 203 may include a plurality of microphones disposed to detect the direction of a sound. According to an embodiment, the sound output devices 207 and 214 may include speakers. The speakers may include an external speaker 207 and a receiver 214 for communication. In certain embodiments, microphone, speakers, and the connector 208 may be disposed in a space arranged in the electronic device 200, and may be exposed to the external environment through at least one hole formed in housing 210. In certain embodiments, a hole formed in the housing 210 commonly used for a microphone and speakers. In certain embodiments, the sound output devices 207 and 214 may include a speaker (e.g., piezo speaker) that operates without using a hole formed in the housing 210.

The sensor modules 204 and 219 may generate electrical signals or data corresponding to an internal operating state of the electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor (e.g., an ultrasonic or optical fingerprint sensor) may be disposed under the display 201 of the first surface 210A. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. The key input device 217 may be implemented using a pressure sensor included in the display 201.

The indicator may be disposed on the first surface 210A of the housing 210. For example, the indicator may provide status information of the electronic device 200 in an optical form. The indicator may provide a light source associated with the operation of the camera module 205. The indicator may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 200 so as to be brought into contact with an external environment through an opening of the display 201, which is perforated up to a front plate 202. According to an embodiment, an area corresponding to some camera module 205 of the display 201 is a part of an area in which content is displayed, and may be formed as a transmission area having designated transmittance. For example, the transmission area may be formed to have transmittance having a range of about 5% to about 20%. The transmission area may include an area overlapped with a valid area (e.g., a field of view (FOV)) of the camera module 205 through which light imaged by an image sensor and for generating an image passes. For example, a transmission area of the display 201 may include an area in which the density of pixels and/or a wiring density are lower than that of surroundings. For example, a transmission area may replace the opening. The camera module 205 may include, for example, under display camera (UDC). In an embodiment, some sensor modules 204 may be arranged to perform their functions without being visually exposed through the front plate 202 in the internal space of the electronic device. For example, in this case, an area of the display 201 facing the sensor module may not require a perforated opening.

Figure 3:
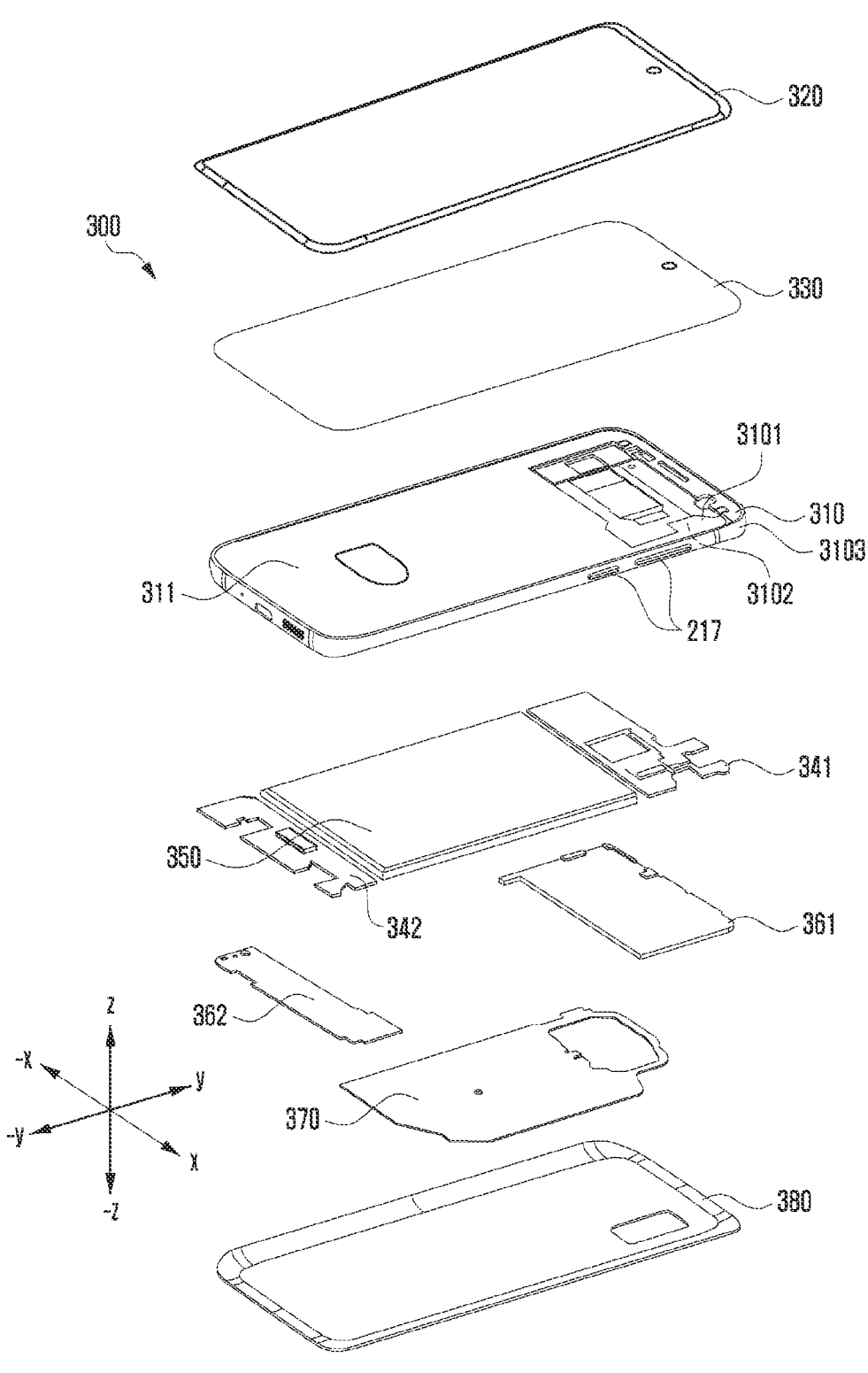
FIG. 3 is an exploded perspective view of an electronic device according to various embodiments.

FIG. 3 is an exploded perspective view pf an electronic device according to various embodiments.

The electronic device 300 in FIG. 3 may be at least partially similar to the electronic device 101 in FIG. 1 and the electronic device 200 in FIG. 2a or may further include other embodiments.

Referring to FIG. 3, an electronic device 300 (e.g., electronic device 101 in FIG. 1) may include a lateral member 310 (e.g., lateral bezel structure 218 in FIG. 2a), a support member 311 (e.g., a bracket or support structure), a front cover 320 (e.g., front plate 202 in FIG. 2a), a display 330 (e.g., display 201 in FIG. 2a), at least one substrate 341 and 342 (e.g., printed circuit board (PCB) or flexible printed circuit board (FPCB)), a battery 350, at least one additional support 361 and 362 (e.g., rear case), an antenna 370, and a rear cover 380 (e.g., rear plate 211). The electronic device 300 may omit at least one (e.g., the support member 311 or the at least one additional support 361 and 362) of the above components or may further include another component. Some components of the electronic device 300 may be the same as or similar to those of the electronic device 100 shown in FIG. 1 or the electronic device 200 FIG. 2a, and thus, descriptions thereof are omitted below.

According to various embodiments, the lateral member 310 may include a first side 3101 directed in a first direction (e.g., z-axis direction), a second side 3102 directed in an opposite direction to the first side 3101, and a lateral side 3103 surrounding a space between the first side 3101 and the second side 3102. According to an embodiment, at least a part of the lateral side 3103 may form an appearance of the electronic device. According to an embodiment, the support member 311 may be disposed to extend from the lateral member 310 toward an inner space of the electronic device 300. In a certain embodiment, the support member 311 may be disposed separately from the lateral member 310. According to an embodiment, the lateral number 310 and/or the support member 311 may be formed of, for example, a metal material and/or a non-metal element (e.g., polymer). According to an embodiment, the support member 311 may be disposed to support at least a part of the display 330 through the first side 3101 and to support the at least one substrate 341 and 342 and/or at least a part of the battery 350 through the second side 3102. According to an embodiment, the at least one substrate 341 and 342 may include the first substrate 341 (e.g., main substrate) disposed on one side and the second substrate 342 (e.g., sub-substrate) disposed on the other side based on the battery 350 in the inner space of the electronic device. According to an embodiment, the first substrate 341 and/or the second substrate 342 may include a processor, a memory, and/or an interface. According to an embodiment, the processor may include, for example, one or more of a central processing unit, an application processor, a graphic processor, an image signal processor, a sensor hub processor, or a communication processor. According to an embodiment, the memory may include, for example, a volatile memory or a nonvolatile memory. According to an embodiment, the interface may include, for example, a high definition multimedia interface (HDMI), a universal serial bus (USB) interface, an SD card interface, and/or an audio interface. For example, the interface may electrically or physically connect the electronic device 300 and an external electronic device to each other, and may include a USB connector, an SD card/MMC connector, or an audio connector. According to an embodiment, the battery 350 is a device for supplying a power to at least one element, and may include, for example, a non-rechargeable primary cell, a rechargeable secondary cell, or a fuel cell. At least a part of the battery 350 may be disposed on, for example, substantially the same plane as the at least one substrate 341 and 342. According to an embodiment, the battery 350 may be disposed in a manner that it is built in the electronic device 300. In a certain embodiment, the battery 350 may be detachably disposed from the electronic device 300.

The antenna 370 may be disposed between the rear cover 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral member 310 and/or the support member 311. In a certain embodiment, the electronic device 300 may further include a digitizer for detecting an external electronic pen.

Figure 4A:
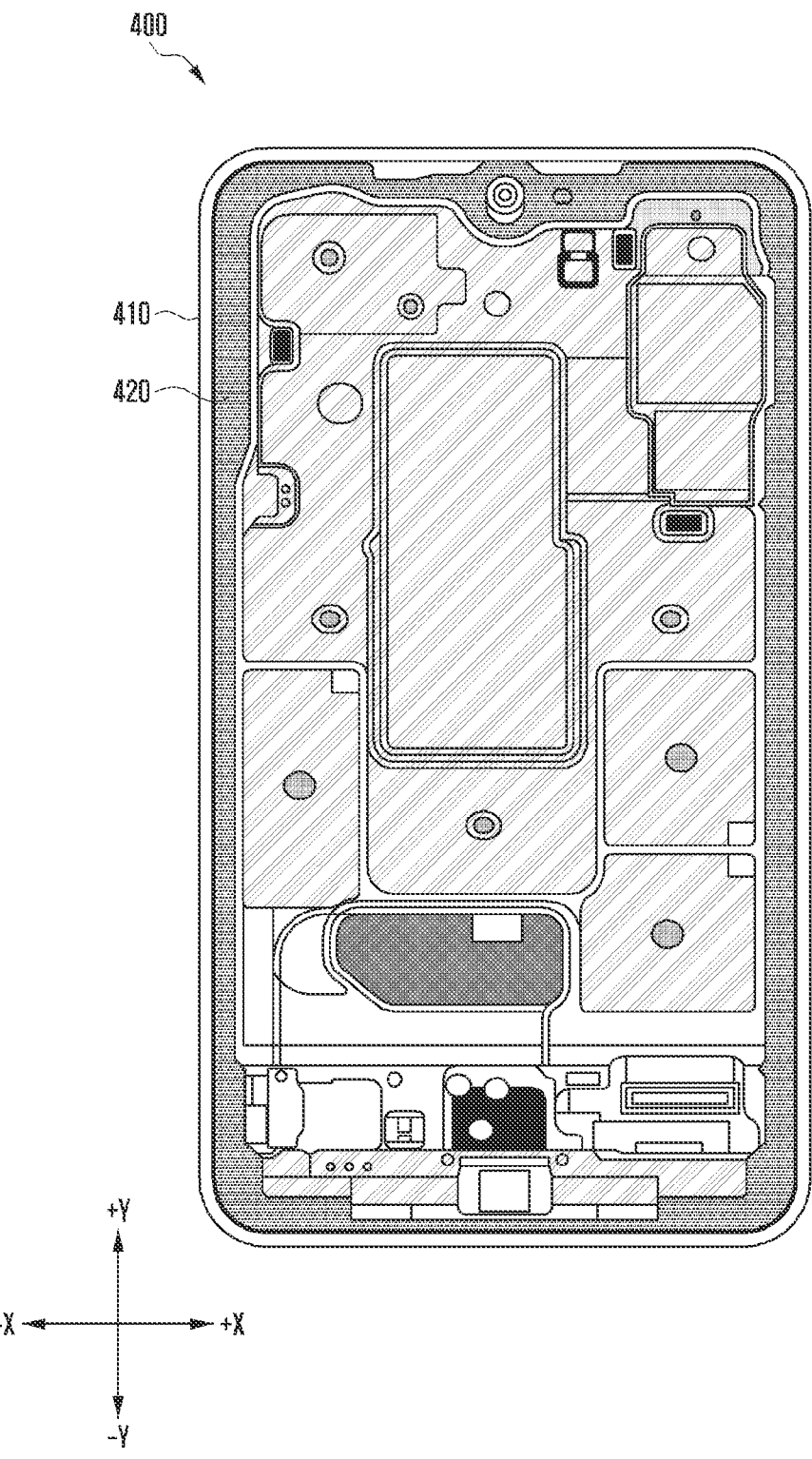
FIGS. 4A and 4B are diagrams illustrating an electronic device according to various embodiments.
Figure 4B:
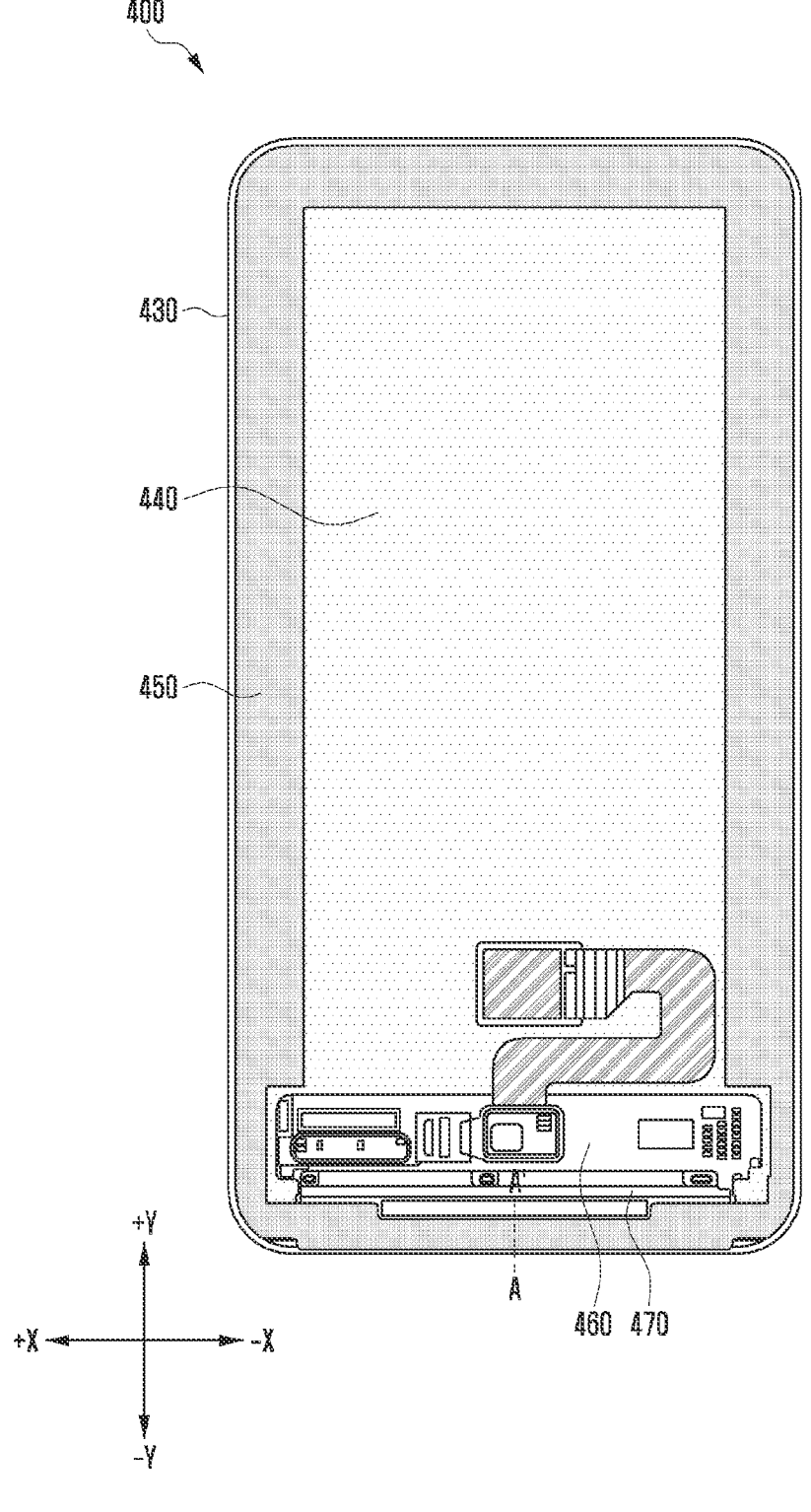

FIGS. 4A and 4B are diagrams illustrating an electronic device 400 according to various embodiments.

FIG. 4A is a diagram illustrating a housing 410 of an electronic device 400 according to various embodiments. FIG. 4B is a diagram illustrating a window cover 430 and a display 440 of an electronic device 400 according to various embodiments.

The electronic device 400 of FIGS. 4A and 4B may refer, for example, to the electronic device 101 of FIG. 1, or may include at least a part of the electronic device 101 of FIG. 1.

The electronic device 400 of FIGS. 4A and 4B may refer, for example, to the electronic device 300 or 400 of FIG. 2 or 3, or may include at least a part of the electronic device 300 or 400 of FIG. 2 or 3.

In describing the electronic device 400 according to an embodiment of the disclosure, a width direction of the electronic device 400 may refer, for example, to an x-axis direction, and a length direction of the electronic device 400 may refer, for example, to a y-axis direction.

With reference to FIGS. 4A and 4B, the electronic device 400 according to an embodiment of the disclosure may include a housing 410, a waterproof member 420, a window cover 430, a display 440, and/or a molding part 450.

In an embodiment, the housing 410 may form an exterior of the electronic device 400. The housing 410 may provide a space in which electronic components of the electronic device 400 are disposed.

In an embodiment, the housing 410 may be formed to extend along the width direction (e.g., x-axis direction) and the length direction (e.g., y-axis direction) of the electronic device 400.

In an embodiment, the waterproof member 420 may be disposed on one surface of the housing 410. The waterproof member 420 may be disposed to extend from the one surface of the housing 410 along a periphery of the housing 410.

In an embodiment, the waterproof member 420 may be a waterproof tape including a waterproof material. The waterproof member 420 may serve to prevent and/or reduce external water from flowing into the electronic device 400.

In an embodiment, on the one surface of the housing 410 illustrated in FIG. 4A, the window cover 430 and the display 440 illustrated in FIG. 4B may be disposed. The window cover 430 and the display 440 may be disposed to cover the one surface of the housing 410.

In an embodiment, the window cover 430 may refer, for example, to the front cover 320 of FIG. 3, or may include at least a part of the front cover 320 of FIG. 3.

In an embodiment, the window cover 430 may include a transparent material so that the display 440 can be exposed (e.g., visible) to outside. For example, the window cover 430 may include a transparent glass or plastic.

In an embodiment, the display 440 may refer, for example, to the display 330 of FIG. 3, or may include at least a part of the display 330 of FIG. 3.

In an embodiment, a circuit board 460 may be disposed on one surface of the display 440. The circuit board 460 may include at least one processor (e.g., processor 120 of FIG. 1). The circuit board 460 may control driving of the display 440 through the processor. The circuit board 460 may be electrically connected to a driving circuit 480 (refer to FIG. 6).

In an embodiment, a circuit cover member 470 may be disposed in one direction (e.g., negative y-axis direction) of the circuit board 460. The circuit cover member 470 may include, for example, a tape disposed to cover one surface of the driving circuit 480 (refer to FIG. 6).

In an embodiment, the molding part 450 may be disposed on the window cover 430 and the one surface of the display 440. The molding part 450 may extend along the window cover 430 and the periphery of the display 440 on the window cover 430 and the one surface of the display 440.

In an embodiment, at least a part of the molding part 450 may be disposed on an outer periphery of the circuit board 460. For example, with reference to FIG. 4B, a part of the molding part 450 may be disposed spaced apart from the circuit board 460 on one side (e.g., negative x-axis direction based on the circuit board 460) and the other side of the circuit board 460.

At least a part of the molding part 450 according to an embodiment may be disposed at a location that overlaps a location where the bending part 441 (refer to FIG. 6) of the display 440 is disposed.

In an embodiment, the width of the molding part 450 may be differently formed depending on the location where the molding part 450 extends. For example, with reference to FIG. 4B, in the molding part 450 extending in a length direction (e.g., y-axis direction) of the electronic device 400, an area of the molding part 450 extending with the circuit board 460 interposed therebetween may be formed with a narrow width as compared to that of other areas.

In an embodiment, in case that the window cover 430 and the display 440 are disposed on one surface of the housing 410, the waterproof member 420 and the molding part 450 may be disposed to come in touch with each other. For example, the waterproof member 420 may be disposed on one surface (e.g., opposite surface to the surface on which the display 440 is located based on the molding part 450) of the molding part 450. The waterproof member 420 and the molding part 450 are disposed to come in contact with each other, and external water can be prevented and/or blocked from flowing into the electronic device 400.

In an embodiment, the waterproof member 420 and the molding part 450 may extend to form a closed loop. For example, the waterproof member 420 and the molding part 450 may form a closed loop through extension in the width direction (e.g., x-axis direction) and the length direction (e.g., y-axis direction) of the electronic device 400 without cut parts.

In an embodiment, the molding part 450 may serve to reduce a gap between internal structures of the electronic device 400. For example, in the display 440, there may be a gap between a part where the circuit board 460 and the circuit cover member 470 are disposed and a part where the circuit board 460 and the circuit cover member 470 are not disposed, and the molding part 450 may extend to reduce the gap between the parts.

In an embodiment, the waterproof member 420 may be disposed on the molding part 450, and it may be easy to completely seal the electronic device 400. For example, due to the gap between the internal structures of the electronic device 400, it may be difficult for the waterproof member 420 to completely seal the electronic device 400. Since the molding part 450 serves to reduce the gap between the internal structures of the electronic device 400, it may be easy to completely seal the electronic device 400 in case that the waterproof member 420 is disposed on the molding part 450.

Since the electronic device 400 according to an embodiment of the disclosure does not include a cure-in-place gasket (CIPG) for connection between the waterproof members 420, but implements the waterproof function of the electronic device 400 in the form in which the waterproof member 420 is disposed on the molding part 450, costs being consumed in the CIPG manufacturing and disposition can be saved. Further, since the electronic device 400 according to an embodiment has a structure that does not include the CIPG, the separation and repair of the window cover 430 and the display 440 may be easy.

Since the electronic device 400 according to an embodiment of the disclosure does not include the bonding part that may be located at the lower end part (e.g., distal end in the negative y-axis direction based on the electronic device 400) of the electronic device 400, a black matrix (BM) area in which the screen is not displayed may be reduced on the display 440.

FIGS. 5A, 5B, 5C, and 5D are include diagrams and perspective views illustrating a molding part 550 according to various embodiments.

Figure 5A:
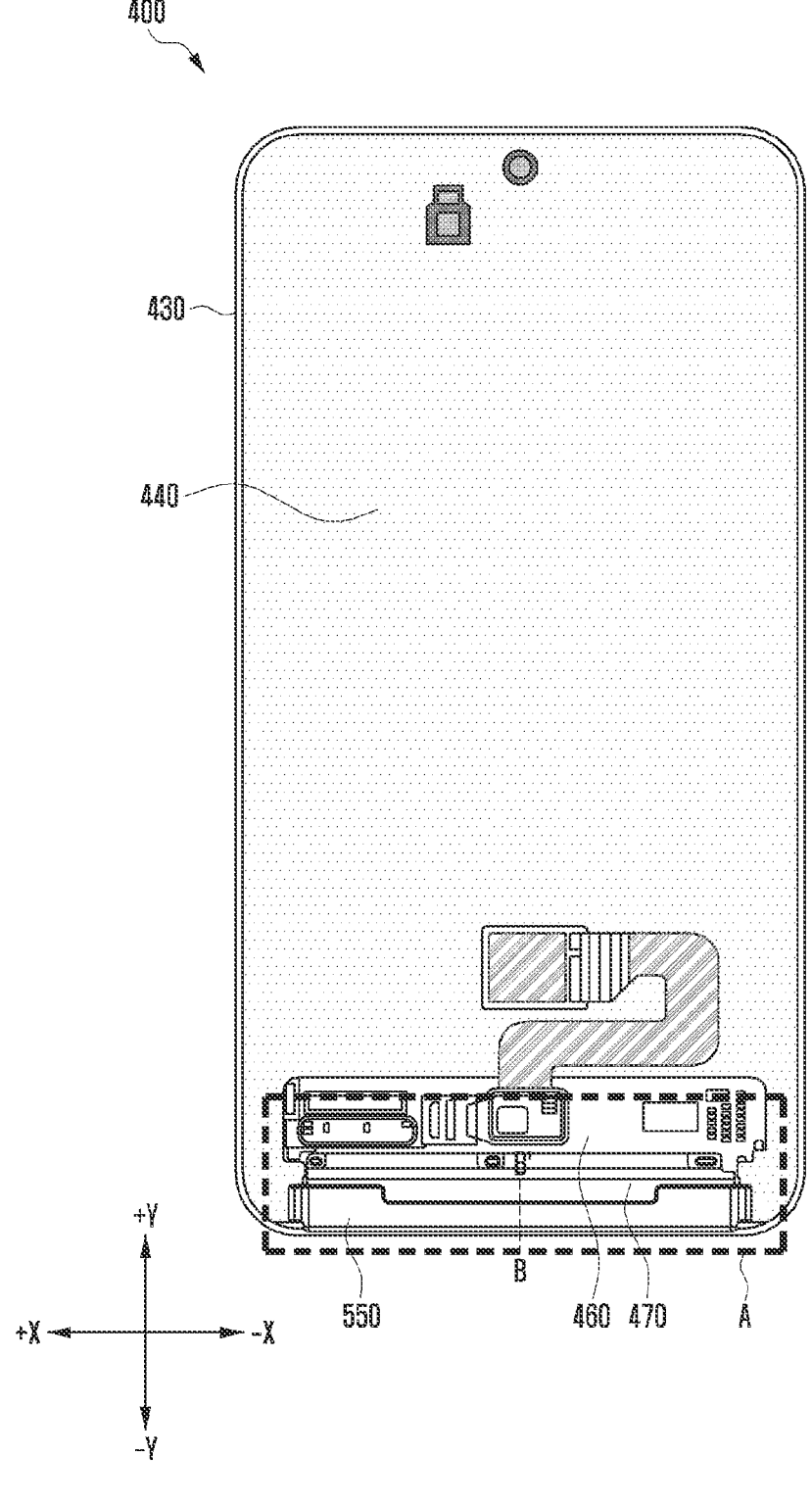
FIGS. 5A, 5B, 5C, and 5D include various diagrams and views illustrating a molding part according to various embodiments.
Figure 5B:
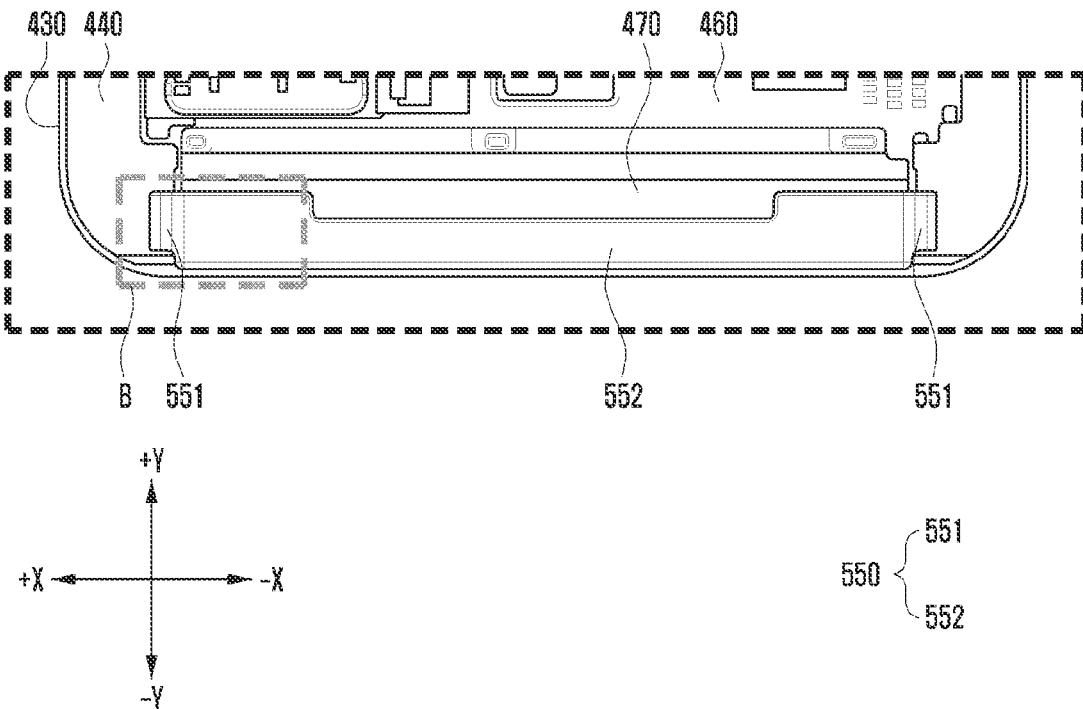
Figure 5C:
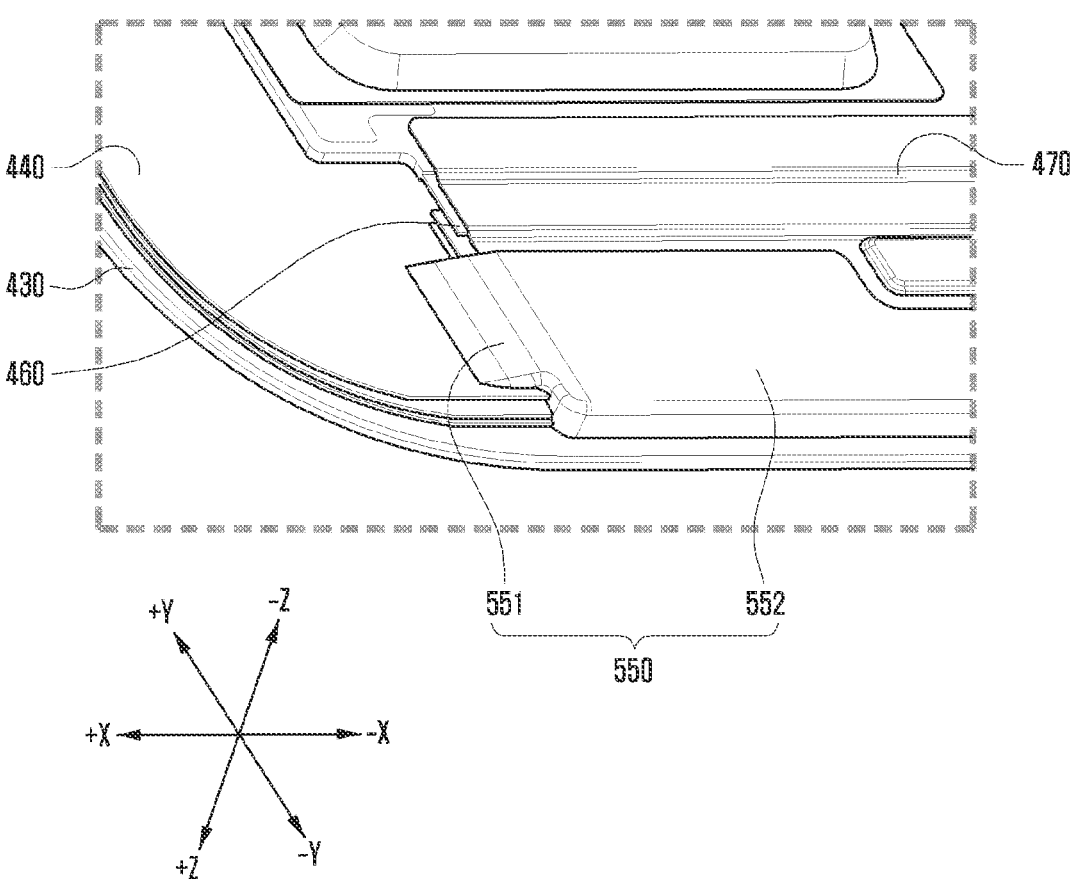
Figure 5D:
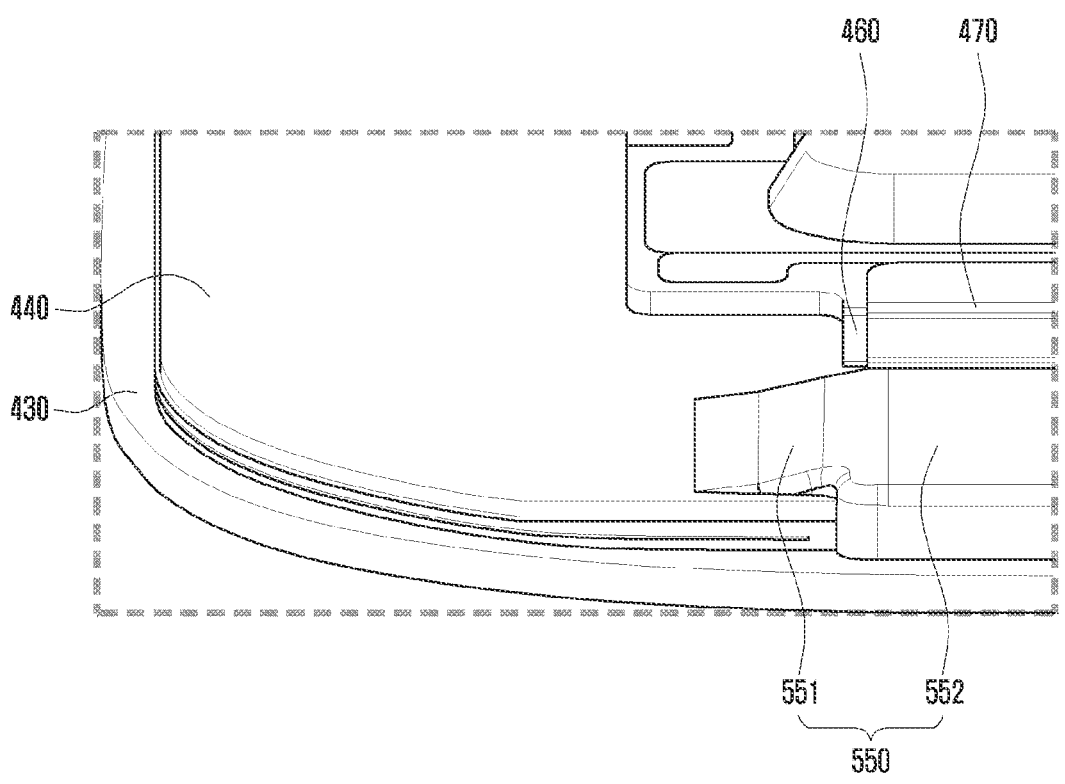

FIG. 5A is a diagram illustrating a molding part 550 disposed at one end of the electronic device 400 according to various embodiments. FIG. 5B is a diagram illustrating an enlarged molding part 550 illustrated in area A of FIG. 5A according to various embodiments. FIG. 5C is a perspective view illustrating an inclined area 551 of a molding part 550 according to various embodiments. FIG. 5D is a perspective view illustrating an inclined area 551 of a molding part 550 in another direction according to various embodiments.

In an embodiment, with reference to FIG. 5A, the molding part 550 may not be disposed to extend along the whole periphery of the electronic device 400, but may be disposed only at one end part of the electronic device 400. For example, the molding part 550 may be disposed only at the distal end located in the negative y-axis direction based on the electronic device 400.

The molding part 550 according to an embodiment may be disposed at a location that overlaps the location where the bending part 441 (refer to FIG. 6) of the display 440 is disposed.

The molding part 550 according to an embodiment may extend along the width direction (e.g., x-axis direction) of the electronic device 400.

In an embodiment, the molding part 550 may extend to cover at least a part of the circuit cover member 470. For example, with reference to FIGS. 5A and 5B, the molding part 550 may be located at the distal end in the negative y-axis direction of the circuit board 460 and the circuit cover member 470, and may extend to cover at least parts of the circuit board 460 and the circuit cover member 470.

With reference to FIG. 5B, the molding part 550 according to an embodiment may be formed to extend along the width direction (e.g., x-axis direction) of the electronic device 400.

In an embodiment, one end of the molding part 550 may refer, for example, to the distal end in the negative x-axis direction based on the molding part 550, and the other end of the molding part 550 may refer, for example, to the distal end in the positive x-axis direction based on the molding part 550.

In an embodiment, one end of the circuit board 460 may refer, for example, to the distal end in the negative x-axis direction based on the circuit board 460, and the other end of the circuit board 460 may refer, for example, to the distal end in the positive x-axis direction based on the circuit board 460.

The molding part 550 according to an embodiment may include the inclined area 551 and/or the extension area 552. The inclined area 551 may be an area that is formed at one end and the other end of the molding part 550. The extension area 552 may be an area that extends between the inclined areas 551.

With reference to FIG. 5B, the molding part 550 according to an embodiment may include the inclined areas 551 at the one end and the other end thereof. The inclined area 551 may be disposed to cover the parts of the circuit board 460 and the display 440 at one end and the other end of the molding part 550.

In an embodiment, the inclined area 551 may be disposed at the location that overlaps the location where one end and the other end of the circuit board 460 are formed.

In an embodiment, the inclined area 551 of the molding part 550 may be an area extending from one surface of the circuit board 460 toward one surface of the display 440.

In an embodiment, the one surface of the display 440 may refer, for example, to a surface that faces the negative z-axis direction based on the display 440.

With reference to FIG. 5C, the molding part 550 according to an embodiment may further extend in the negative z-axis direction based on the one surface of the display 440. For example, the molding part 550 may extend to have a thickness in the z-axis direction based on the one surface of the display 440.

According to an embodiment, since the molding part 550 further extends in the z-axis direction as compared to the one surface of the display 440, the extension area 552 of the molding part 550 may be disposed at a location having moved further in the height direction (e.g., negative z-axis direction) of the electronic device 400 as compared to the one surface of the display 440.

In an embodiment, the extension area 552 of the molding part 550 may be formed to extend along the width direction (e.g., x-axis direction) of the electronic device 400 while facing the negative z-axis direction based on the molding part 550.

With reference to FIGS. 5A and 5B, the inclined area 551 of the molding part 550 may extend toward the one surface of the display 440 in an inclined direction based on a plane being substantially parallel to the extension area 552.

In an embodiment, the thickness (e.g., length in the z-axis direction of the inclined area 551) of the inclined area 551 may get thicker as it gets closer to the extension area 552. For example, the inclined area 551 may be formed so that the thickness of the inclined area 551 becomes smaller as the inclined area 551 gets farther away from the extension area 552.

In an embodiment, at least a part of the waterproof member 420 (refer to FIG. 4A) may be disposed on the molding part 550. For example, at least a part of the waterproof member 420 (refer to FIG. 4A) may be disposed in the form in which it extends along the inclined area 551 and the extension area 552 of the molding part 550.

In an embodiment, in case that the molding part 550 includes the inclined area 551, the waterproof member 420 (refer to FIG. 4A) may extend to come in close contact with the molding part 550, a gap space may not be formed between the waterproof member 420 (refer to FIG. 4A) and the display 440. For example, in case that the molding part 550 does not include the inclined area 551, a gap space may be formed between the waterproof member 420 (refer to FIG. 4A) and the display 440 due to the gap of one surface of the display 440 and the circuit board 460. In case that the molding part 550 includes the inclined area 551, the molding part 550 may extend along the inclined area 551 to be connected to the one surface of the display 440, and thus the waterproof member 420 (refer to FIG. 4A) extends to come in completely close contact with the molding part 550, and the gap space may not be formed between the waterproof member 420 (refer to FIG. 4A) and the display 440.

In an embodiment, the molding part 450 illustrated in FIG. 4B may include the inclined area 551 illustrated in FIG. 5B. An area of the molding part 450 illustrated in FIG. 4B, extending from the circuit board 460 to the one surface of the display 440, may be formed in the same form as that of the inclined area 551 illustrated in FIG. 5B. For example, the area of the molding part 450 illustrated in FIG. 4B, extending from the circuit board 460 to the one surface of the display 440, may extend from the one surface of the circuit board 460 in the inclined direction toward the one surface of the display 440.

Figure 6:
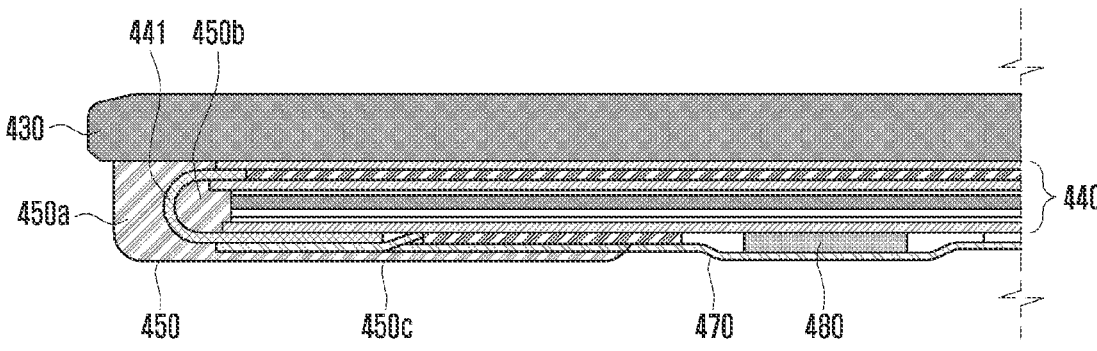
FIG. 6 is a cross-sectional view illustrating a bending part of a display according to various embodiments.
Figure 6:
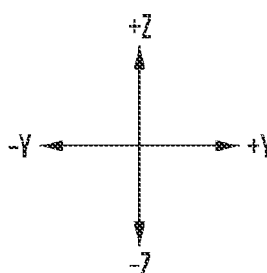

FIG. 6 is a cross-sectional view illustrating a bending part 441 of a display 440 according to various embodiments.

FIG. 6 is a cross-sectional view illustrating a window cover 430 and a display 440 taken along line A-A' of FIG. 4B according to various embodiments.

In describing the display 440 according to an embodiment of the disclosure, the length direction of the display 440 may refer, for example, to the y-axis direction, and the height direction of the display 440 may refer, for example, to the z-axis direction. The length direction and the height direction of the display 440 may be substantially the same as the length direction and the height direction of the electronic device 400.

In an embodiment, the display 440 may be disposed on one surface of the window cover 430. For example, the display 440 may be disposed on the surface facing the negative z-axis direction based on the window cover 430.

In an embodiment, the display 440 may include a plurality of layers. For example, the display 440 may include an adhesive layer, a display panel, a protection layer that protects the display panel, a blocking layer that blocks electromagnetic waves flowing from the display panel, and/or a support layer that absorbs an impact from outside.

In an embodiment, the display 440 may include the bending part 441 that is at least partly bent and extends. The bending part 441 may be located at one end part of the display 440 (e.g., distal end in the negative y-axis direction in the display 440).

In an embodiment, the bending part 441 may extend in the length direction (e.g., y-axis direction) of the display 440, and then may be bent to extend in the height direction (e.g., z-axis direction) of the display 440.

In an embodiment, an inward direction of the electronic device 400 based on the bending part 441 may refer, for example, to a direction directed from the bending part 441 toward an inside of the electronic device 400. For example, with reference to FIG. 6, the inward direction of the electronic device 400 based on the bending part 441 may refer, for example, to the positive y-axis direction based on the bending part 441.

In an embodiment, an outward direction of the electronic device 400 based on the bending part 441 may refer, for example, to a direction directed from the bending part 441 toward an outside of the electronic device 400. For example, with reference to FIG. 6, the outward direction of the electronic device 400 based on the bending part 441 may refer, for example, to the negative y-axis direction based on the bending part 441.

In an embodiment, at least a part of the bending part 441 may be convexly formed in the outward direction of the electronic device 400.

In an embodiment, one surface of the bending part 441 may refer, for example, to a surface facing the outward direction (e.g., negative y-axis direction) of the electronic device 400 based on the bending part 441, and the other surface of the bending part 441 may refer, for example, to a surface facing the inward direction (e.g., positive y-axis direction) of the electronic device 400 based on the bending part 441.

In an embodiment, the molding part 450 may include a first molding area 450*a*, a second molding area 450*b*, and/or a third molding area 450*c*.

In an embodiment, at least a part of the molding part 450 may be disposed on one surface of the bending part 441, and at least a part of the molding part 450 may be disposed on the other surface of the bending part 441. For example, the first molding area 450*a* may be disposed on the one surface of the bending part 441. The second molding area 450*b* may be disposed on the other surface of the bending part 441.

In an embodiment, the bending part 441 may be disposed spaced apart from the window cover 430 in the height direction (e.g., z-axis direction) of the electronic device 400. At least a part of the molding part 450 may be disposed in a space formed due to the spacing between the bending part 441 and the window cover 430.

In an embodiment, the rigidity of the bending part 441 may be reinforced through disposition of the molding part 450 on one surface and the other surface of the bending part 441 of the display 440. Since the bending part 441 includes a shape that is bent and extends, it may be vulnerable to an external impact in case of being not supported due to a separate structure. The molding part 450 may be disposed on one surface and the other surface of the bending part 441, and may serve to reinforce rigidity of the bending part 441 by supporting the bending part 441.

In an embodiment, the driving circuit 480 may be disposed in one direction of the display 440. For example, the driving circuit 480 may be disposed in the negative z-axis direction based on the display 440.

In an embodiment, the driving circuit 480 may be a display driving circuit (display driver integrated circuit (DDI)). The driving circuit 480 may be electrically connected to the display 440. The driving circuit 480 may serve to control a plurality of pixels included in the display 440.

In an embodiment, the circuit cover member 470 may be disposed in one direction of the driving circuit 480. For example, the circuit cover member 470 may be disposed in the negative z-axis direction based on the driving circuit 480. The circuit cover member 470 may be disposed to cover one surface of the driving circuit 480, and may serve to protect the driving circuit 480.

In an embodiment, the molding part 450 may be disposed on at least a part of the circuit cover member 470. For example, the third molding area 450c of the molding part 450 may be disposed to cover at least one of the circuit cover member 470 in the negative z-axis direction based on the circuit cover member 470.

In an embodiment, the molding part 450 may be formed using injection molding. For example, after the display 440 is manufactured, the molding part 450 may be disposed on the bending part 441 of the display through insert injection molding.

In an embodiment, FIG. 6 may be a cross-sectional view illustrating the window cover 430 and the display 440 taken along line B-B' of FIG. 5A according to various embodiments. In case that FIG. 6 is a cross-sectional view illustrating the window cover 430 and the display 440 along the cross section B-B' illustrated in FIG. 5A, the molding part 450 illustrated in FIG. 6 may refer, for example, to the molding part 550 illustrated in FIG. 5A. For example, as illustrated in FIG. 6, the molding part 550 of FIG. 5A may be disposed on one surface and the other surface of the bending part 441 of the display 440, and may be disposed to cover at least one of the circuit cover member 470.

Figure 7A:
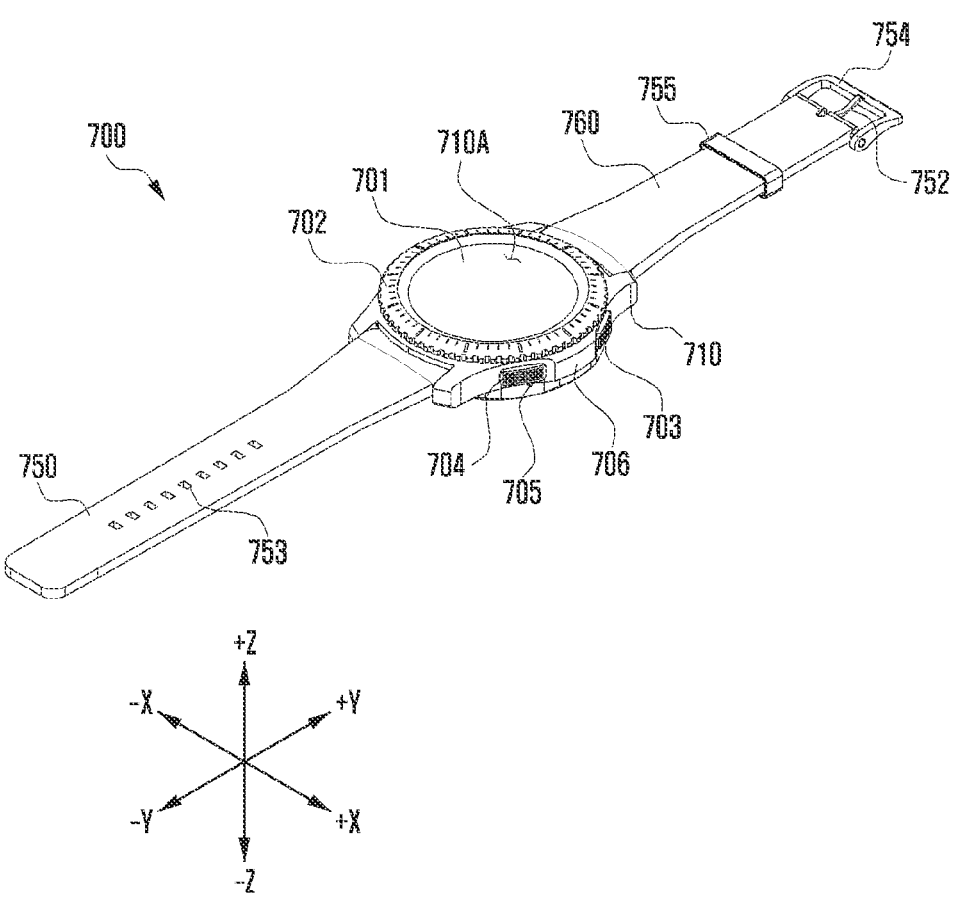
FIGS. 7A and 7B are front and rear perspective views, respectively, illustrating an electronic device according to various embodiments.
Figure 7B:
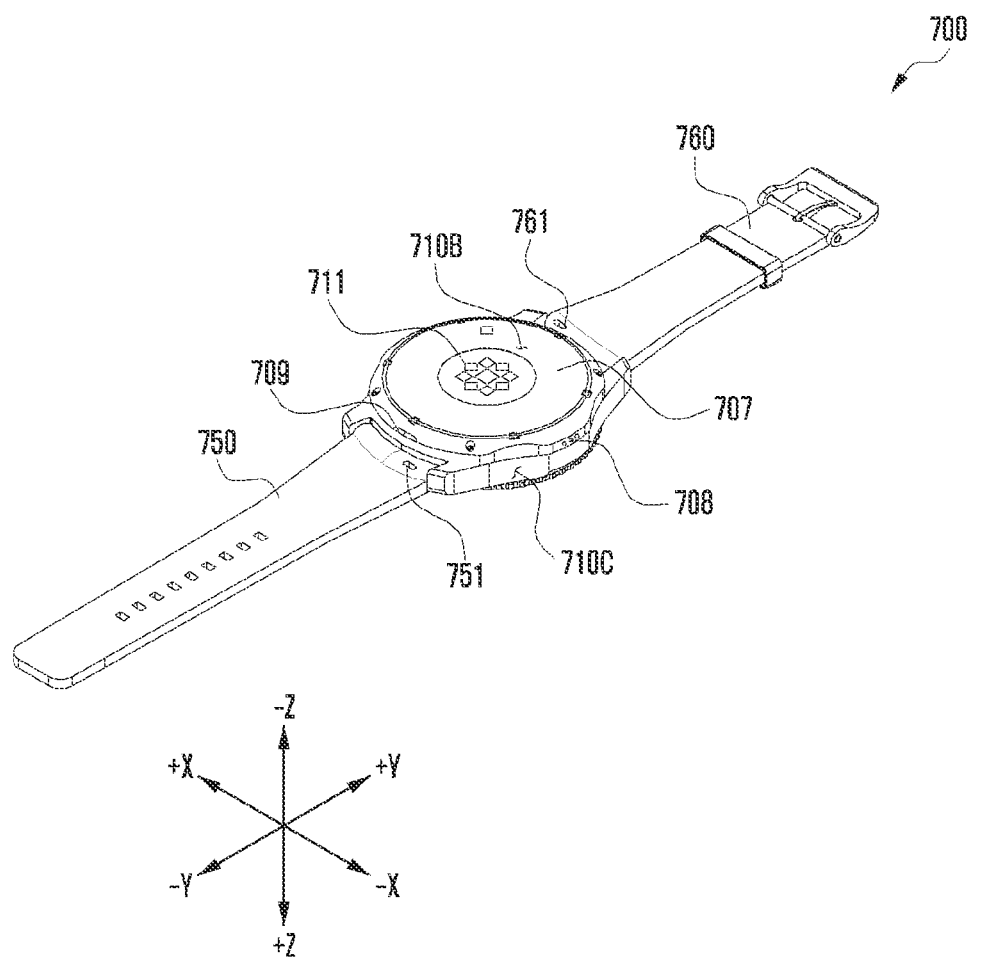

FIGS. 7A and 7B are respectively front and rear perspective views illustrating an electronic device 700 according to various embodiments.

FIG. 7A is a front perspective view illustrating an electronic device 700 according to various embodiments.

FIG. 7B is a rear perspective view of an electronic device 700 according to various embodiments.

With reference to FIGS. 7A and 7B, an electronic device 700 according to an embodiment may include a housing 710 including a first surface (or front surface) 710A, a second surface (or rear surface) 710B, and a lateral surface 710C surrounding a space between the first surface 710A and the second surface 710B, and fastening members 750 and 760 connected to at least a part of the housing 710 and configured to detachably attach the electronic device 700 to a user's body part (e.g., wrist or ankle).

In an embodiment (not illustrated), the housing may be referred to as a structure that forms some of the first surface 710A, the second surface 710B, and the lateral surface 710C in FIG. 7A. According to an embodiment, at least a part of the first surface 710A may be formed by a substantially transparent front plate 701 (e.g., a glass plate or polymer plate including various coating layers). The second surface 710B may be formed by a rear plate 707. The rear plate 707 may be formed by, for example, coated or colored glass, ceramic, polymer, metal (e.g., aluminum, stainless steel (STS), or magnesium), or combinations of at least two of the above materials. The lateral surface 710C may be formed by a lateral bezel structure (or "lateral member) 706 that is combined with the front plate 701 and the rear plate 707, and includes metal and/or polymer. In a certain embodiment, the rear plate 707 and the lateral bezel structure 706 may be integrally formed, and may include the same material (e.g., metal material such as aluminum).

The fastening members 750 and 760 may be formed of various materials and shapes. Assembled and plural unit links may be flexibly formed by weave, leather, rubber, synthetic resin, metal, ceramic, or combinations of at least two of the above materials.

According to an embodiment, the electronic device 700 may include at least one of a display 720 (refer to FIG. 8), audio modules 705 and 708, a sensor module 711, key input devices 702, 703, and 704, and a connector hole 709. In a certain embodiment, at least one of constituent elements of the electronic device 700 (e.g., the key input devices 702, 703, and 704, connector hole 709, or sensor module 711) may be omitted, or other constituent elements may be additionally included.

The display 720 may be visually exposed (e.g., visible), for example, through a significant part of the front plate 701. The shape of the display 720 may correspond to the shape of the front plate 701, and may be a circle, an ellipse, or a polygon. The display 720 may be disposed to be combined with or to be adjacent to a touch sensing circuit, a pressure sensor capable of measuring intensity (pressure) of a touch, and/or a fingerprint sensor.

The audio modules 705 and 708 may include a microphone hole 705 and a speaker hole 708. In the microphone hole 705, a microphone for obtaining an outside sound may be disposed, or in a certain embodiment, a plurality of microphone may be disposed so as to sense the direction of the sound. The speaker hole 708 may be used for an external speaker and a receiver for calling. In a certain embodiment, speaker holes 708 and a microphone hole 703 may be implemented as one hole, or a speaker (e.g., piezo-electric speaker) may be included without the speaker holes 708.

The sensor module 711 may generate an electrical signal or a data value corresponding to an internal operation state of the electronic device 700 or an external environment state. The sensor module 711 may include, for example, a biosensor module (e.g., HRM sensor, oxygen saturation sensor, and/or blood glucose sensor) disposed toward the second surface 710B of the housing 710. The electronic device 700 may further include a sensor module (not illustrated), for example, a gesture sensor, gyro sensor, barometric pressure sensor, magnetic sensor, acceleration sensor, grip sensor, color sensor, infrared (IR) sensor, biosensor, temperature sensor, humidity sensor, or illumination sensor.

The key input devices 702, 703, and 704 may include a wheel key 702 disposed on the first surface 710A of the housing 710 and being rotatable in at least one direction, and/or side key buttons 703 and 704 disposed on the lateral surface 710C of the housing 710. The wheel key 702 may have a shape corresponding to the shape of the front plate 701. In an embodiment, the electronic device 700 may not include some or all of the above-mentioned key input devices 702, 703, and 704, and the key input devices 702, 703, and 704 that are not included may be implemented in the form of a soft key and a touch key on the display 720. The connector hole 709 may accommodate a connector (e.g., USB connector) for transmitting and receiving a power and/or data to and from an external electronic device, or may include another connector hole (not illustrated) that can accommodate the connector for transmitting and receiving an audio signal to and from the external electronic device.

The electronic device 700 may further include, for example, a connector cover (not illustrated) configured to cover at least a part of the connector hole 709 and to block an inflow of foreign substances against the connector hole 709.

The fastening members 750 and 760 may be detachably attached to at least a partial area of the housing 710 using locking members 751 and 761. The fastening members 750 and 760 may include one or more of a fixing member 752, a fixing member fastening hole 753, a band guide member 754, and a band fixing ring 755.

The fixing member 752 may be configured to fix the housing 710 and the fastening members 750 and 760 to the user's body part (e.g., wrist or ankle). The fixing member fastening hole 753 may fix the housing 710 and the fastening members 750 and 760 to the user's body part to correspond to the fixing member 752. Since the band guide member 754 is configured to limit a movement range of the fixing member 752 when the fixing member 752 is fastened to the fastening hole 753, the fastening members 750 and 760 can be closely attached to the user's body part. The band fixing ring 755 may limit the movement range of the fastening members 750 and 760 in a state where the fixing member 752 and the fixing member fastening hole 753 are fastened to each other.

Figure 8:
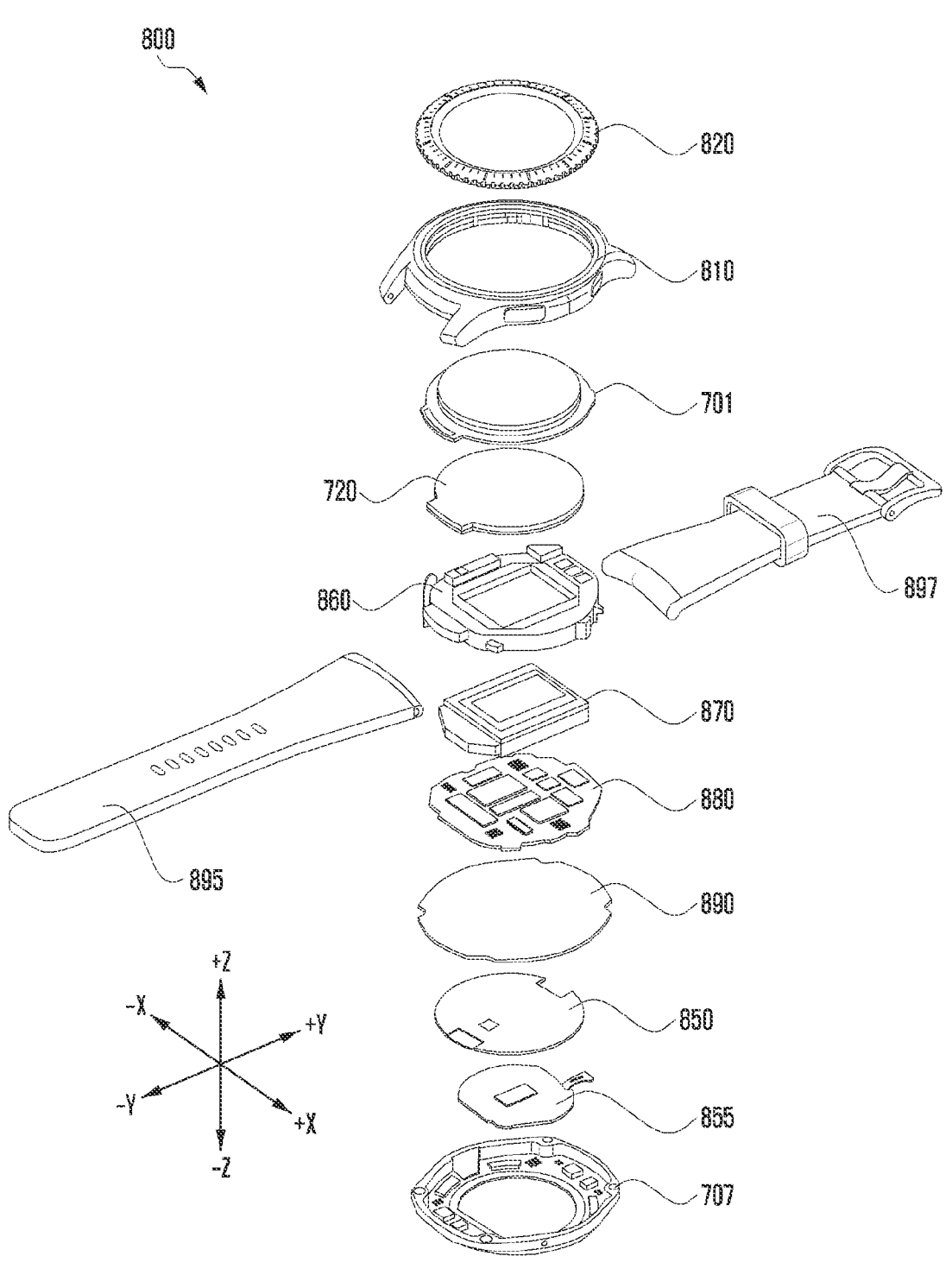
FIG. 8 is an exploded perspective view illustrating an electronic device according to various embodiments.

FIG. 8 is an exploded perspective view illustrating an electronic device 800 according to various embodiments.

With reference to FIG. 8, the electronic device 800 may include a bezel structure 810, a wheel key 820, a front plate 701, a display 720, a first antenna 850, a second antenna 855, a support member 860 (e.g., bracket), a battery 870, a printed circuit board 880, a sealing member 890, a rear plate 707, and fastening members 895 and 897.

At least one of elements of an electronic device 800 according to an embodiment may be the same as or similar to at least one of elements of an electronic device 700 of FIG. 7A or 7B, and hereinafter, the duplicate description thereof may be omitted.

The support member 860 may be disposed inside the electronic device 800, and may be connected to the bezel structure 810, or may be integrally formed with the bezel structure 810. The support member 860 may be formed of, for example, a metal material and/or a non-metal (e.g., polymer) material. The support material 860 may have one surface combined with the display 720 and the other surface combined with the printed circuit board 880. On the printed circuit board 880, a processor, a memory, and/or an interface. The processor may include, for example, one or more of a central processing unit, an application processor, a graphic processing unit (GPU), a sensor processor, or a communication processor.

The memory may include, for example, a volatile memory or a nonvolatile memory. The interface may include, for example, a high definition multimedia interface (HDMI), a universal serial bus (USB) interface, an SD card interface, and/or an audio interface. For example, the interface may electrically or physically connect the electronic device 800 to an external electronic device, and may include a USB connector, an SD card/MMC connector, or an audio connector.

The battery 870 is a device for supplying a power to at least one element, and may include, for example, a non-rechargeable primary cell, or a rechargeable secondary cell, or a fuel cell. At least a part of the battery 870 may be disposed, for example, on substantially the same plane as the plane of the printed circuit board 880. The battery 870 may be integrally disposed inside the electronic device 800, or may be detachably disposed in the electronic device 800.

The first antenna 850 may overlap the second antenna 855, and may be disposed between the circuit board 880 and the rear plate 707. The first antenna 850 may include, for example, a near field communication (NFC) antenna, a wireless charging antenna, and/or a magnetic secure transmission (MST) antenna. For example, the first antenna 850 may perform near field communication with an external device, may wirelessly transmit and receive the power required for charging, or may transmit a magnetism-based signal including a near field communication signal or payment data. In an embodiment, an antenna structure may be formed by parts of the bezel structure 810 and/or the support member 860, or a combination thereof. In still an embodiment, the first antenna 850 may be disposed on the circuit board 880 in the form of a chip antenna.

The second antenna 855 may be disposed between the circuit board 880 and the rear plate 807. The second antenna 855 may include, for example, a near field communication (NFC) antenna, a wireless charging antenna, and/or a magnetic secure transmission (MST) antenna. For example, the second antenna 855 may perform near field communication with an external device, may wirelessly transmit and receive the power required for charging, or may transmit a magnetism-based signal including a near field communication signal or payment data. In an embodiment, an antenna structure may be formed by parts of the bezel structure 810 and/or the rear plate 707, or a combination thereof.

The sealing member 890 may be located between the bezel structure 810 and the rear plate 807. The sealing member 890 may be configured to block moisture and foreign substances flowing from outside into the space surrounded by the bezel structure 810 and the rear plate 807.

Figure 9:
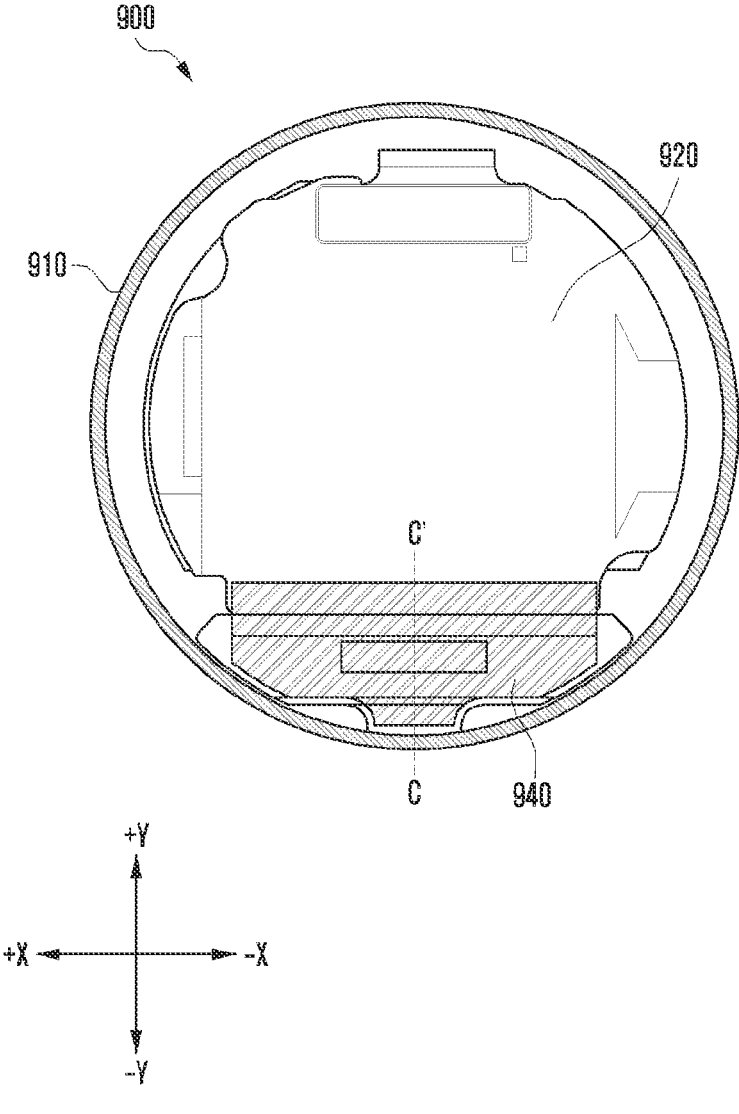
FIG. 9 is a diagram illustrating a window cover and a display of an electronic device according to various embodiments.

FIG. 9 is a diagram illustrating a window cover 910 and a display 920 of an electronic device 900 according to various embodiments.

An electronic device 900 according to an embodiment of the disclosure may refer, for example, to the electronic device 700 or 800 illustrated in FIGS. 7A, 7B, and 8, or may include at least a part of the electronic device 700 or 800. For example, the electronic device 900 may be a wearable electronic device that can be worn on at least a part of the body of the user who uses the electronic device 900. For example, the electronic device 900 may be detachably attached to a part of the body of the user using fastening members 750 and 760.

In an embodiment, the electronic device 900 may include a window cover 910, a display 920, a driving circuit 930 (refer to FIG. 10), and/or a circuit cover member 940.

The window cover 910 according to an embodiment may refer, for example, to a front plate 701 of FIG. 7A, or may include at least a part of the front plate 701.

In an embodiment, the window cover 910 may be disposed to cover a housing 710 (refer to FIG. 7A). For example, the window cover 910 may be disposed in one direction (e.g., positive z-axis direction) based on the housing 710 (refer to FIG. 7A), and may cover at least a part of the housing 710 (refer to FIG. 7A).

In an embodiment, at least a part of the window cover 910 may be formed substantially transparently. For example, at least a part of the window cover 910 may be formed substantially transparently so that a display 920 can be exposed (e.g., visible) to the outside.

The display 920 according to an embodiment may refer, for example, to the display 720 of FIG. 8, or may include at least a part of the display 720.

In an embodiment, the window cover 910 and the display 920 may be formed in shapes that correspond to each other.

For example, with reference to FIG. 9, in case that the display 920 is formed in a circular shape, the window cover 910 may be formed in a corresponding circular shape.

Although FIG. 9 illustrates that the window cover 910 and the display 920 are formed in the circular shape, this is simply an example, and the shapes of the window cover 910 and the display 920 may not be limited thereto. For example, the window cover 910 and the display 920 may be formed in an elliptical or polygonal shape.

In an embodiment, the display 920 may be exposed (e.g., visible) through at least a part of the window cover 910. The display 920 may be driven by a driving circuit 930 (refer to FIG. 10).

Figure 10:
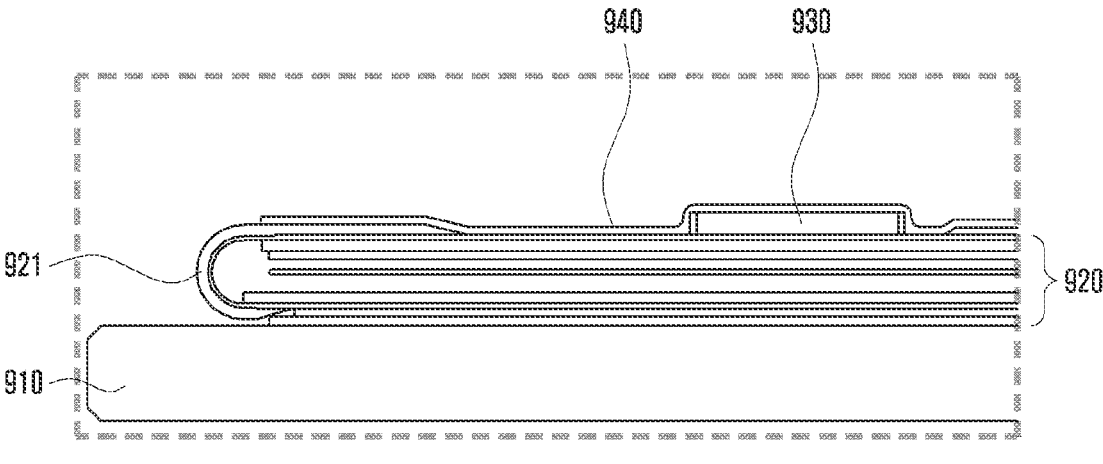
FIG. 10 is a cross-sectional view illustrating a bending part of a display according to various embodiments.
Figure 10:
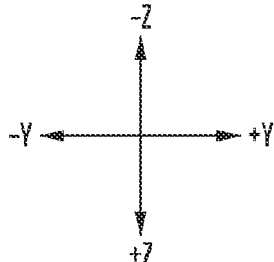

In an embodiment, a circuit cover member 940 may be a member disposed to cover one surface of the driving circuit 930 (refer to FIG. 10).

In an embodiment, the circuit cover member 940 may be disposed on the window cover 910 and one end part of the display 920. For example, the circuit cover member 940 may be disposed at distal end in the negative y-axis direction based on the window cover 910 and the display 920.

FIG. 10 is a cross-sectional view illustrating a bending part 921 of a display 920 according to various embodiments.

FIG. 10 is a cross-sectional view illustrating a window cover 910 and a display 920 taken along line C-C' of FIG. 9.

In describing the display 920 according to an embodiment of the disclosure, the length direction of the display 920 may refer, for example, to the y-axis direction, and the height direction of the display 920 may refer, for example, to the z-axis direction. The length direction and the height direction of the electronic device 900 may be substantially the same as the length direction and the height direction of the display 920.

In an embodiment, the display 920 may be disposed on one surface of the window cover 910. For example, the display 920 may be disposed on the surface facing the negative z-axis direction based on the window cover 910.

In an embodiment, the display 920 may include a plurality of layers. For example, the display 920 may include an adhesive layer, a display panel, a protection layer that protects the display panel, a blocking layer that blocks electromagnetic waves flowing from the display panel, and/or a support layer that absorbs an impact from outside.

In an embodiment, the display 920 may include a bending part 921 that is at least partly bent and extends. The bending part 921 may be located at one end part of the display 920 (e.g., distal end in the negative y-axis direction in the display 920).

In an embodiment, the bending part 921 may extend in the length direction (e.g., y-axis direction) of the display 920, and then may be bent to extend in the height direction (e.g., z-axis direction) of the display 920.

In an embodiment, an inward direction of the electronic device 900 based on the bending part 921 may refer, for example, to a direction directed from the bending part 921 toward an inside of the electronic device 900. For example, with reference to FIG. 10, the inward direction of the electronic device 900 based on the bending part 921 may refer, for example, to the positive y-axis direction based on the bending part 921.

In an embodiment, an outward direction of the electronic device 900 based on the bending part 921 may refer, for example, to a direction directed from the bending part 921 toward an outside of the electronic device 900. For example, with reference to FIG. 10, the outward direction of the electronic device 900 based on the bending part 921 may refer, for example, to the negative y-axis direction based on the bending part 921.

In an embodiment, at least a part of the bending part 921 may be convexly formed in the outward direction (e.g., negative y-axis direction) of the electronic device 900.

In an embodiment, the bending part 921 may be disposed spaced apart from the window cover 910 in the height direction (e.g., z-axis direction) of the electronic device 900.

In an embodiment, the driving circuit 930 may be disposed in one direction of the display 920. For example, the driving circuit 930 may be disposed in the negative z-axis direction based on the display 920.

In an embodiment, the driving circuit 930 may be a display driving circuit (display driver integrated circuit (DDI)). The driving circuit 930 may be electrically connected to the display 920. The driving circuit 930 may serve to control a plurality of pixels included in the display 920.

In an embodiment, the circuit cover member 940 may be disposed in one direction of the driving circuit 930. For example, the circuit cover member 940 may be disposed in the negative z-axis direction based on the driving circuit 930. The circuit cover member 940 may be disposed to cover one surface of the driving circuit 930, and may serve to protect the driving circuit 930.

Figure 11A:
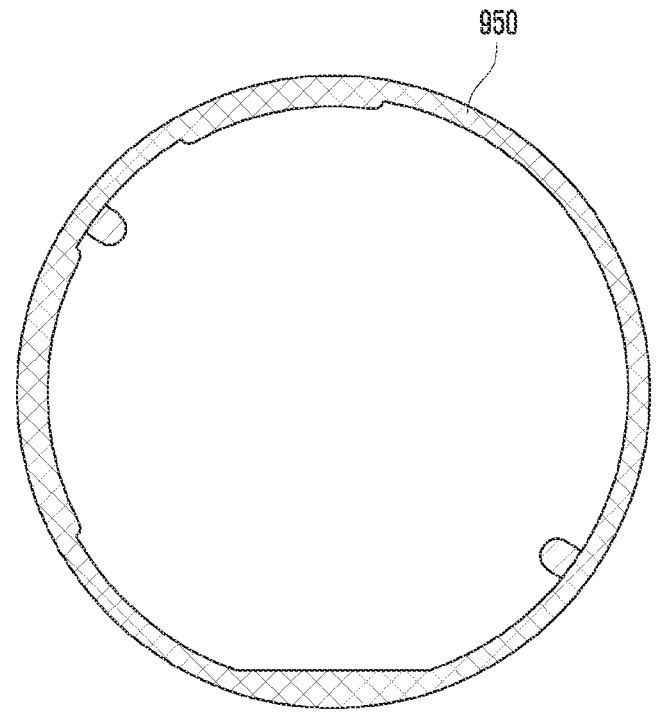
FIGS. 11A and 11B are diagrams illustrating a molding part and a display on which the molding part is disposed according to various embodiments.
Figure 11B:
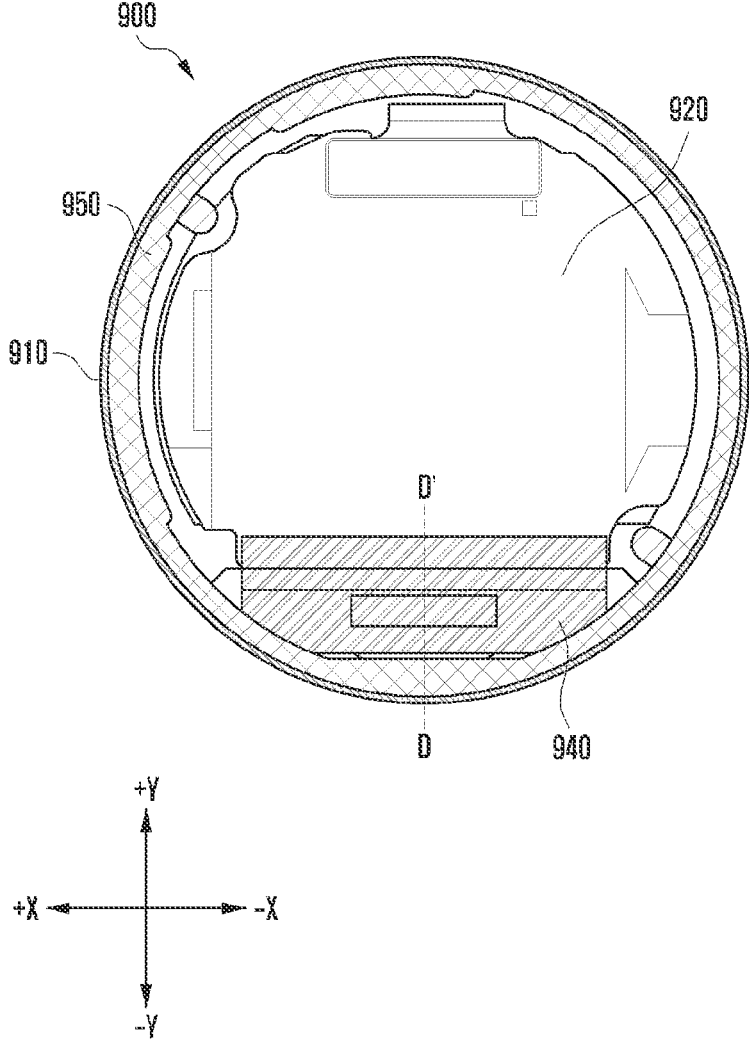

FIGS. 11A and 11B are diagrams illustrating a molding part 950 and a display 920 on which the molding part 950 is disposed according to various embodiments.

FIG. 11A is a diagram illustrating a molding part 950 according to various embodiments. FIG. 11B is a diagram illustrating a window cover 910 and a display 920 on which a molding part 950 is disposed according to various embodiments.

With reference to FIGS. 11A and 11B, the molding part 950 according to an embodiment may be formed to extend along the window cover 910 and a peripheral shape of the display 920. For example, in case that the window cover 910 and the display 920 include circular shapes, the molding part 950 may be formed to extend in a circular peripheral shape.

Although FIG. 11A illustrates that the molding part 950 extends in a circular peripheral shape, this is merely an example, and the shape of the molding part 950 may not be limited thereto. For example, in case that the window cover 910 and the display 920 include a rectangular shape, the molding part may be formed to extend in the rectangular peripheral shape.

With reference to FIG. 11B, the molding part 950 may be disposed on the window cover 910 and one surface of the display 920. For example, the molding part 950 may be disposed along the window cover 910 and the periphery of the display 920 on the window cover 910 and the one surface of the display 920.

With reference to FIGS. 11A and 11B, the width of the molding part 950 may be differently formed depending on the location where the molding part 950 is disposed. For example, the width of the molding part 950 disposed on the bending part 921 (refer to FIG. 10) of the display 920 located at the distal end in the negative y-axis direction based on the display 920 may be formed to be larger as compared to the width of the molding part 950 disposed in other areas.

In an embodiment, the molding part 950 may serve to reduce a step height between internal structures of the electronic device 900. For example, the molding part 950 may extend, and it may be possible to reduce the gap between the part where the circuit cover member 940 is disposed and the part where the circuit cover member 940 is not disposed on the display 920.

Figure 12:
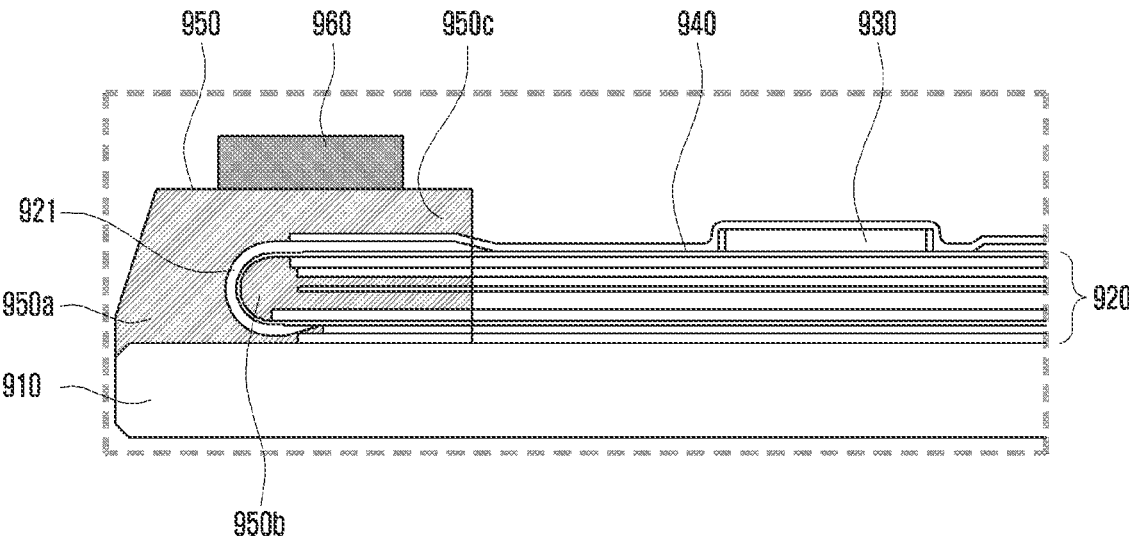
FIG. 12 is a cross-sectional view illustrating a bending part of a display, a molding part, and a waterproof member according to various embodiments.
Figure 12:
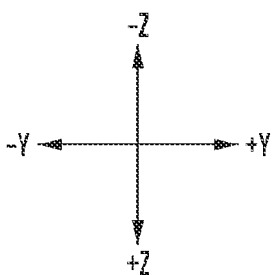

FIG. 12 is a cross-sectional view illustrating a bending part 921 of a display 920, a molding part 950, and a waterproof member 960 according to various embodiments.

FIG. 12 is a cross-sectional view illustrating the bending part 921 of the display 920, the molding part 950, and the waterproof member 960 taken along line D-D' of FIG. 11B according to various embodiments.

In an embodiment, one surface of the bending part 921 may refer, for example, to a surface facing an outward direction (e.g., negative y-axis direction) of the electronic device 900 based on the bending part 921, and the other surface of the bending part 921 may refer, for example, to a surface facing an inward direction (e.g., positive y-axis direction) of the electronic device 900 based on the bending part 921.

In an embodiment, the molding part 950 may include a first molding area 950*a*, a second molding area 950*b*, and/or a third molding area 950*c*.

In an embodiment, at least a part of the molding part 950 may be disposed on one surface of the bending part 921, and at least a part of the molding part 950 may be disposed on the other surface of the bending part 921. For example, the first molding area 950*a* may be disposed on the one surface of the bending part 921. The second molding area 950*b* may be disposed on the other surface of the bending part 921.

In an embodiment, at least a part of the molding part 950 may be disposed in a space that is formed due to the spacing between the bending part 921 and the window cover 910.

In an embodiment, the molding part 950 may be disposed on at least a part of the circuit cover member 940. For example, the third molding area 950*c* of the molding part 950 may be disposed to cover at least a part of the circuit cover member 940 in the negative z-axis direction based on the circuit cover member 940.

In an embodiment, the molding part 950 may be formed using an injection molding manufacturing method. For example, after the display 920 is manufactured, the molding part 950 may be disposed on the bending part 921 of the display 920 through insert injection molding.

In an embodiment, the rigidity of the bending part 921 may be reinforced through disposition of the molding part 950 on one surface and the other surface of the bending part 921 of the display 920. Since the bending part 921 includes a shape that is bent and extends, it may be vulnerable to an external impact in case of being not supported due to a separate structure. The molding part 950 may be disposed on the bending part 921, and may serve to reinforce the rigidity of the bending part 921 by supporting the bending part 921.

In an embodiment, the waterproof member 960 may be disposed on the molding part 950. For example, the waterproof member 960 may be disposed in the negative z-axis direction based on the molding part 950. The waterproof member 960 may extend along the window cover 910 and the periphery of the display 920 in a direction in which the molding part 950 extends.

In an embodiment, the waterproof member 960 may be a waterproof tape including a waterproof material. The waterproof member 960 may serve to prevent and/or reduce external water from flowing into the electronic device 900.

In an embodiment, the waterproof member 960 may be disposed on the molding part 950, and it may be easy to completely seal the electronic device 900. For example, it may be difficult for the waterproof member 960 to completely seal the electronic device 900 due to the gap between the internal structures of the electronic device 900. Since the molding part 950 serves to reduce the gap between the internal structures of the electronic device 900, it may be easy to completely seal the electronic device 900 in case that the waterproof member 960 is disposed on the molding part 950.

An electronic device according to an example embodiment of the disclosure may include: a housing; a waterproof member comprising a waterproof material disposed along a periphery of the housing on one surface of the housing; a window cover disposed to face the one surface of the housing; a display disposed between the window cover and the housing and including a bending part located at one end part of the electronic device; and a molding part extending along peripheries of the window cover and the display and disposed on one surface of the waterproof member.

In an example embodiment, at least a part of the molding part may be disposed in one direction toward an outside of the electronic device and in another direction opposite to the one direction based on the bending part of the display.

In an example embodiment, the bending part of the display may extend from one end part of the electronic device in a length direction of the electronic device, may be bent to extend in a height direction of the electronic device, and may be convexly formed in one direction toward the outside of the electronic device.

In an example embodiment, at least a part of the molding part may be disposed on one surface of the bending part convexly formed in the direction toward the outside of the electronic device and on the other surface of the bending part being an opposite surface to the one surface.

In an example embodiment, the bending part of the display may be spaced apart from the window cover in a height direction of the electronic device.

In an example embodiment, the molding part may be disposed in a space formed by the disposition of the bending part of the display spaced apart from the window cover.

In an example embodiment, the electronic device may include a driving circuit configured to drive the display; a circuit board disposed on one surface of the display and electrically connected to the driving circuit; and a circuit cover disposed to cover the driving circuit.

In an example embodiment, an area of the molding part, extending from the circuit board to the one surface of the display, may extend from one surface of the circuit board in an inclined direction toward the one surface of the display.

In an example embodiment, the molding part may be disposed to cover at least a part of the circuit cover.

In an example embodiment, the molding part may be disposed on the bending part of the display using insert injection molding.

In an example embodiment, the width of the molding part may be differently formed depending on the location where the molding part extends.

An electronic device according to an example embodiment of the disclosure may include: a housing; a waterproof member comprising a waterproof material disposed along a periphery of the housing on one surface of the housing; a window cover disposed to face the one surface of the housing; a display disposed between the window cover and the housing and including a bending part located at one end part of the electronic device; and a molding part extending from the one end part of the electronic device along the bending part of the display and disposed on one surface of the waterproof member.

In an example embodiment, the molding part may include inclined areas respectively extending from one end and the other end of the molding part toward one surface of the display in a direction inclined based on one surface of the molding part, and at least a part of the molding part may be disposed in one direction toward an outer side of the electronic device and in another direction opposite to the one direction based on the bending part of the display.

In an example embodiment, at least a part of the molding part may be disposed on one surface of the bending part convexly formed in the direction toward the outside of the electronic device and on the other surface of the bending part being an opposite surface to the one surface.

In an example embodiment, the molding part may be disposed in a space formed by the disposition of the bending part of the display spaced apart from the window cover.

In an example embodiment, the molding part may further include an extension area located at a location having been moved in a height direction of the electronic device as compared to the one surface of the display and extending between the inclined areas.

In an example embodiment, the inclined area may be formed so that a thickness of the inclined area becomes smaller as the inclined area extends farther away from the extension area.

In an example embodiment, the molding part may be disposed to cover at least a part of a circuit cover.

In an example embodiment, the molding part may be disposed on the bending part of the display using insert injection molding.

An electronic device according to an example embodiment of the disclosure may include: a housing; fasteners connected to at least a part of the housing and configured to detachably attach the electronic device to a part of a body; a window cover disposed to face one surface of the housing; a display disposed between the window cover and the housing and including a bending part located at one end part of the electronic device; a molding part extending along peripheries of the window cover and the display; and a waterproof member comprising a waterproof material disposed between the molding part and the housing.

In an example embodiment, at least a part of the molding part may be disposed in one direction toward an outside of the electronic device and in another direction opposite direction to the one direction based on the bending part of the display.

In an example embodiment, the bending part of the display may extend from one end part of the electronic device in a length direction of the electronic device, may be bent to extend in a height direction of the electronic device, and may be convexly formed in one direction toward the outside of the electronic device.

In an example embodiment, the at least a part of the molding part may be disposed on one surface of the bending part convexly formed in the direction toward the outside of the electronic device and on another surface of the bending part opposite to the one surface.

In an example embodiment, the bending part of the display may be disposed spaced apart from the window cover in a height direction of the electronic device.

In an example embodiment, the molding part may be disposed in a space formed by the disposition of the bending part of the display spaced apart from the window cover.

In an example embodiment, the molding part may be disposed on the bending part of the display using insert injection molding.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, a home appliance, or the like. The electronic devices according to embodiments of the disclosure are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with an embodiment of the disclosure, the term "module" may include a unit implemented in hardware, software, or firmware, or any combination thereof, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., module or program) of the above-described components may include a singular or a plurality of entities, and some of the plurality of entities may be separately disposed in any other component. According to an embodiment, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration.

According to an embodiment, operations performed by a module, program, or other component may be executed sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a housing;
a waterproof member comprising a waterproof material disposed along a periphery of the housing on one surface of the housing;
a window cover disposed to face the one surface of the housing;
a display disposed between the window cover and the housing and including a bending part located at one end part of the electronic device; and
a molding part disposed on one surface of the waterproof member and disposed adjacent to the bending part, and comprising a first portion corresponding to an inner surface of the bending part and a second portion corresponding to an outer surface of the bending part, wherein the molding part comprises:
a planar area comprising a planar surface that is substantially parallel to a front surface of the display, and
an inclined area extending from opposite ends of the planar area toward a rear surface of the display opposite the front surface of the display and comprising an inclined surface inclined from the planar surface.

2. The electronic device of claim 1, wherein the bending part of the display extends from one end part of the electronic device in a length direction of the electronic device, is bent to extend in a height direction of the electronic device, and is convexly formed toward an outside of the electronic device.

3. The electronic device of claim 1, wherein the bending part of the display is spaced apart from the window cover in a height direction of the electronic device, and the molding part is disposed in a space formed by the bending part spaced apart from the window cover.

4. The electronic device of claim 1, further comprising:
a driving circuit configured to drive the display;
a circuit board disposed on the rear surface of the display and electrically connected to the driving circuit; and
a circuit cover disposed to cover the driving circuit.

5. The electronic device of claim 4, wherein the molding part is disposed to cover at least a part of the circuit cover.

6. The electronic device of claim 1, wherein the molding part is disposed on the bending part of the display using insert injection molding.

7. The electronic device of claim 1, wherein a width of the molding part is differently formed according to a location where the molding part extends.

8. The electronic device of claim 1,
wherein the inclined area of the molding part is configured to reduce a gap between at least a portion of the bending part and a portion of the waterproof member.

9. The electronic device of claim 5,
wherein the inclined area of the molding part is configured to reduce a gap between at least a portion of the circuit cover and a portion of the waterproof member.

* * * * *